(12) United States Patent
Krone et al.

(10) Patent No.: US 6,323,796 B1
(45) Date of Patent: *Nov. 27, 2001

(54) DIGITAL ISOLATION SYSTEM WITH ADC OFFSET CALIBRATION

(75) Inventors: Andrew W. Krone; Timothy J. Dupuis; Jeffery W. Scott; Navdeep S. Sooch; David R. Welland, all of Austin, TX (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/516,898

(22) Filed: Mar. 1, 2000

Related U.S. Application Data

(63) Continuation-in-part of application No. 08/841,409, filed on Apr. 22, 1997, and application No. 08/837,702, filed on Apr. 22, 1997, now Pat. No. 5,807,046, and application No. 08/837,714, filed on Apr. 22, 1997.

(51) Int. Cl.[7] .................................................. H03M 3/02
(52) U.S. Cl. .......................................... 341/143; 375/219
(58) Field of Search .......................... 341/143; 375/219, 375/259, 220, 222; 379/399, 412, 413

(56) References Cited

U.S. PATENT DOCUMENTS

| | | |
|---|---|---|
| 3,750,024 | 7/1973 | Dunn et al. . |
| 3,904,833 | 9/1975 | Beene et al. . |
| 3,981,006 | 9/1976 | Takayama et al. . |
| 4,053,720 | 10/1977 | Wycheck ................................ 179/99 |
| 4,054,941 | 10/1977 | Shichman . |
| 4,066,843 | 1/1978 | Waks et al. . |
| 4,118,603 | 10/1978 | Kumhyr . |
| 4,192,978 | 3/1980 | Vincent ........................ 179/170 NC |
| 4,216,426 | 8/1980 | Flora ...................................... 455/28 |
| 4,271,526 | 6/1981 | Flora ...................................... 375/17 |
| 4,292,595 | 9/1981 | Smith .................................... 330/10 |
| 4,349,821 | 9/1982 | Vancsa . |
| 4,384,274 | 5/1983 | Mao . |
| 4,393,516 | 7/1983 | Itani . |
| 4,415,777 | 11/1983 | Agnew . |
| 4,417,099 | 11/1983 | Pierce ............................... 179/2 DP |
| 4,475,208 | 10/1984 | Ricketts . |
| 4,528,664 | 7/1985 | Cheng et al. . |
| 4,529,845 | 7/1985 | Boeckmann ....................... 179/84 L |
| 4,540,854 | 9/1985 | Beirne .............................. 179/18 FA |
| 4,541,104 | 9/1985 | Hirosaki . |
| 4,567,331 | 1/1986 | Martin .......................... 179/170 NC |

(List continued on next page.)

OTHER PUBLICATIONS

Crystal Semiconductor Corp., "A Family of AES–EBU Interface Devices," David Knapp et al., p. 8.
Rockwell International Digital Communications Division, RC144Aci and RC144ACL Modem Designer's Guide (Preliminary), Order No. 876, Rev. 1, Nov. 1994.

(List continued on next page.)

*Primary Examiner*—Peguy Jeanpierre
*Assistant Examiner*—Joseph J Lauture
(74) *Attorney, Agent, or Firm*—O'Keefe, Egan & Peterman

(57) ABSTRACT

A digital capacitive isolation barrier system is provided that is suitable for use in a telephone or modem where the locally powered circuits must be effectively isolated from the public telephone system, while permitting data transfer across the barrier. In particular, an automatic ADC offset calibration system is provided for determining the magnitude of the ADC offset signal required in the system during a calibration operation, and for providing the ADC offset signal during normal operation of the isolation barrier system. Fixed bias signals are also provided for the ADC and for a DAC in the system. In a preferred embodiment, the ADC is located on the isolated side of the isolation barrier, while the integrator and register that determine and hold the offset signal are located on the powered side of the isolation barrier.

21 Claims, 15 Drawing Sheets

U.S. PATENT DOCUMENTS

| | | |
|---|---|---|
| 4,594,577 | 6/1986 | Mao . |
| 4,607,170 | 8/1986 | Wickman . |
| 4,644,526 | 2/1987 | Wu ............................................ 370/30 |
| 4,656,661 | 4/1987 | Carbrey . |
| 4,686,697 | 8/1987 | Shapiro et al. . |
| 4,686,699 | 8/1987 | Wilkie . |
| 4,712,233 | 12/1987 | Kuo . |
| 4,720,811 | 1/1988 | Yamaguchi et al. . |
| 4,741,031 | 4/1988 | Grandstaff ............................ 379/375 |
| 4,757,528 | 7/1988 | Falater et al. ........................ 379/412 |
| 4,835,486 | 5/1989 | Somerville ............................ 330/10 |
| 4,843,339 | 6/1989 | Burt et al. ............................ 330/10 |
| 4,864,605 | 9/1989 | Ramsay et al. ...................... 379/379 |
| 4,901,217 | 2/1990 | Wilson . |
| 4,901,275 | 2/1990 | Hardie et al. ........................ 364/900 |
| 4,943,807 | 7/1990 | Early et al. . |
| 4,993,063 | 2/1991 | Kiko .................................... 379/405 |
| 4,995,111 | 2/1991 | Tojo et al. ............................ 379/382 |
| 4,996,529 | 2/1991 | Connell . |
| 5,012,950 | 5/1991 | Nishikawa . |
| 5,032,819 | 7/1991 | Sakuragi et al. . |
| 5,051,799 | 9/1991 | Paul et al. . |
| 5,068,659 | 11/1991 | Sakaguchi ............................ 341/143 |
| 5,086,454 | 2/1992 | Hirzel . |
| 5,087,914 | 2/1992 | Sooch et al. ........................ 341/120 |
| 5,097,503 | 3/1992 | Cotty .................................. 379/399 |
| 5,136,630 | 8/1992 | Breneman et al. .................. 379/64 |
| 5,204,896 | 4/1993 | Oliver .................................. 379/106 |
| 5,224,154 | 6/1993 | Aldridge et al. . |
| 5,235,634 | 8/1993 | Oliver .................................. 379/106 |
| 5,237,511 | 8/1993 | Caird et al. . |
| 5,245,654 | 9/1993 | Wilkison et al. .................... 379/405 |
| 5,248,970 | 9/1993 | Sooch et al. ........................ 341/120 |
| 5,258,721 | 11/1993 | Zanders . |
| 5,260,941 | 11/1993 | Wilder et al. . |
| 5,262,779 | 11/1993 | Sauer . |
| 5,287,107 | 2/1994 | Gampell et al. .................... 341/137 |
| 5,311,588 | 5/1994 | Polcyn et al. . |
| 5,323,451 | 6/1994 | Yatsunami . |
| 5,329,281 | 7/1994 | Baumgartner et al. ............. 341/139 |
| 5,329,585 | 7/1994 | Susak et al. ........................ 379/399 |
| 5,333,196 | 7/1994 | Jakab . |
| 5,337,338 | 8/1994 | Sutton et al. ........................ 377/33 |
| 5,343,514 | 8/1994 | Snyder . |
| 5,343,516 | 8/1994 | Callele et al. . |
| 5,355,407 | 10/1994 | Lazik . |
| 5,355,468 | 10/1994 | Jeppesen, III et al. . |
| 5,361,067 | 11/1994 | Pinckley . |
| 5,361,296 | 11/1994 | Reyes et al. . |
| 5,369,666 | 11/1994 | Folwell et al. ........................ 375/8 |
| 5,375,051 | 12/1994 | Decker et al. . |
| 5,377,260 | 12/1994 | Long . |
| 5,384,808 | 1/1995 | Van Brunt et al. .................... 375/36 |
| 5,390,249 | 2/1995 | Park . |
| 5,406,283 | 4/1995 | Leung . |
| 5,410,594 | 4/1995 | Maruyama .......................... 379/398 |
| 5,426,698 | 6/1995 | Reymond . |
| 5,428,682 | 6/1995 | Apfel .................................. 379/413 |
| 5,438,678 | 8/1995 | Smith . |
| 5,442,694 | 8/1995 | Chitrapu et al. . |
| 5,459,721 | 10/1995 | Yoshida . |
| 5,467,385 | 11/1995 | Reuben et al. . |
| 5,473,552 | 12/1995 | Chen et al. . |
| 5,500,894 | 3/1996 | Hershbarger ........................ 379/399 |
| 5,500,895 | 3/1996 | Yurgelites .......................... 379/412 |
| 5,506,900 | 4/1996 | Fritz .................................. 379/402 |
| 5,506,903 | 4/1996 | Yamashita . |
| 5,509,068 | 4/1996 | Bayless et al. . |
| 5,511,118 | 4/1996 | Gores et al. . |
| 5,521,967 | 5/1996 | Novas et al. . |
| 5,533,053 | 7/1996 | Hershbarger ........................ 375/257 |
| 5,544,241 | 8/1996 | Dibner et al. . |
| 5,546,448 | 8/1996 | Caswell et al. . |
| 5,555,100 | 9/1996 | Bloomfield et al. . |
| 5,561,712 | 10/1996 | Nishihara . |
| 5,577,104 | 11/1996 | Knuth et al. . |
| 5,592,529 | 1/1997 | Linsker . |
| 5,598,157 | 1/1997 | Kornblum et al. . |
| 5,602,912 | 2/1997 | Hershbarger ........................ 379/402 |
| 5,644,629 | 7/1997 | Chow . |
| 5,654,984 | 8/1997 | Hershbarger et al. .............. 375/257 |
| 5,655,010 | 8/1997 | Bingel .............................. 379/93.28 |
| 5,659,608 | 8/1997 | Stiefel . |
| 5,675,640 | 10/1997 | Tappert et al. . |
| 5,692,041 | 11/1997 | Torazzina ............................ 379/379 |
| 5,694,465 | 12/1997 | Apfel . |
| 5,705,978 | 1/1998 | Frick et al. . |
| 5,721,774 | 2/1998 | Stiefel . |
| 5,737,411 | 4/1998 | Apfel et al. . |
| 5,740,241 | 4/1998 | Koenig et al. . |
| 5,745,060 | 4/1998 | McCartney et al. . |
| 5,751,803 | 5/1998 | Shpater . |
| 5,790,656 | 8/1998 | Rahamim et al. .................. 379/399 |
| 5,805,687 | 9/1998 | Westergaard et al. . |
| 5,818,923 | 10/1998 | Consiglio et al. . |
| 5,841,840 | 11/1998 | Smith et al. . |
| 5,848,133 | 12/1998 | Kuwahara et al. . |
| 5,859,584 | 1/1999 | Counsell et al. . |
| 5,870,046 | 2/1999 | Scott et al. . |
| 5,875,235 | 2/1999 | Mohajeri . |
| 5,881,102 | 3/1999 | Samson . |
| 5,881,129 | 3/1999 | Chen et al. . |
| 5,901,210 | 5/1999 | Schley-May . |
| 5,907,596 | 5/1999 | Karnowski . |
| 5,914,671 | 6/1999 | Tuttle . |
| 5,917,364 | 6/1999 | Nakamura . |
| 5,940,459 | 8/1999 | Hsu et al. . |
| 5,946,393 | 8/1999 | Holocombe . |
| 5,959,372 | 9/1999 | Every . |
| 5,982,317 | 11/1999 | Madsen . |
| 5,991,335 | 11/1999 | Price . |
| 6,005,923 | 12/1999 | Lee . |
| 6,061,051 | 5/2000 | Chan et al. . |
| 6,072,778 | 6/2000 | Labedz et al. . |
| 6,081,586 | 6/2000 | Rahamin et al. . |
| 6,111,939 | 8/2000 | Brabanec . |
| 6,137,827 * | 10/2000 | Scott et al. ........................ 375/219 |
| 6,160,885 * | 12/2000 | Scott et al. ........................ 379/399 |
| 6,167,134 * | 12/2000 | Scott et al. ........................ 379/413 |

OTHER PUBLICATIONS

Crystal Semiconductor CS4303 (CDB4303) Datasheet "107db, D/A Converter for Digital Audio," pp. 2.3–2.29 (Aug. 1993).

Crystal Semiconductor CS5326 (CDB5326), CS 5327 (CDB5327), CS5328 (CDB5328), CS5329 (CDB5329), Datasheet, "16 and 18–Bit, Stero A/D Converters for Digital Audio," pp. 3.5–3.37 (Mar. 1992).

Crystal Semiconductor CDB5345 Datasheet, "Evaluation Board for CS5344," pp. 3.73–3.99 (Aug. 1993).

Crystal Semiconductor CS8411, CS8412 Preliminary Product Information "Digital Audio Interface Receiver," pp. 6.35–6.67 (Nov. 1993).

Crystal Semiconductor (Divison of Cirrus Logic) CS8401A, CS84102A Datasheet "Digital Audio Interface Transmitter," pp. 6.3–6.33 (Nov. 1993).

Burr–Brown ISO122 Datasheet, "Precision Lowest Cost Isolation Amplifier," pp. 1–15 (Nov. 1993).

Burr–Brown Application Bulletin, "Single–Supply Operation of Isolation Amplifier," pp. 1–4 (Aug. 1991).

Burr–Brown Application Bulletin, "Boost ISO120 Bandwidth to More than 100kHz," pp. 1–3 (Sep. 1990).

Burr–Brown Application Bulletin, "Simple Output Filter Eliminates ISO AMP Output Ripple and Keep's Full Bandwidth," pp. 1–3 (Jan. 1991).

Burr–Brown Application Bulletin, "Very Low Cost Analog Isolation with Power," pp. 1–4 (Mar. 1991).

Burr–Brown Application Bulletin, "IC Building Blocks form Complete Isolated 4–20mA Current–Loop Systems," pp. 1–9 (JUn. 1992).

Burr–Brown Application Bulletin, "Single Supply 4–20mA Current Loop Receiver," pp. 1–2 (Jun. 1991).

Audio Cidec '97 Component Spefication Rev. 1.03, pp. 1–50 (Sep. 15, 1996).

Boser et al., the Design of Sigma–Delta Modulation Analog-to–Digital Converters, IEEE J. Solid–State Circuits, vol. SC–23, pp. 1298–1308, Dec. 1988.

Candy, A Use of Double Integration in Sigma Delta Modulation, IEEE Trans. Commun., vol. COM–33, pp. 249–258, Mar. 1985.

Naus, et al., A CMOS Streo 16–bit D/A Converter for Digital Audio, IEEE J. Soild–State Circuits, vol. SC–22, pp. 390–395, JUn. 1987.

Silicon Systems, SSA 73D2950/2950T Low Power FAX/Data Modem Chip Set Advance Inforamtion, pp. 4–75–4–105, Dec. 1993.

Siemens, "*ICS For Communication Analog Line Interface Solution ALIS*", PSB 4595 Version 2.0 and PSB 4596 Version 2.1 Product Overview 08.97, 19 pages (1997).

Krypton, "*$K^2 930G$ Functional and Electrical Descrptions*", 10 pages (1997).

Lucent Technologies, LUCL8576 Dual Subscriber Line Interface Circuit, Advanced Data Sheet Issue 1.3, 16 pages, Jan. 8, 1997.

Information Sheet—Siemens, DAA2000 Optical DAA Kit—Preliminary, pp. 1–21; Jun. 13, 1997.

Siemens Press Release, Siemens Pioneers Programmable Front End For Analog Modems single Design For Worldwide Standards, Aug. 6, 1997.

Information Sheet—Siemens, Ics for communictions, ALIS Reference Board, SIPB 4595 Version 1.0, Technical Description 06.97, Q67220–H1014, Jun. 1997.

Information Sheet—Siemens, Ics for Communications, ALIS Evaluation Board, SIPB 45900 Version 1.1, Technical Description 06.97, Q67220–H1047, Jun. 1997.

Information Sheet—Siemens, ALIS—Development Tools Evaluation Board, pp. 1–3, Jul. 21, 1997.

* cited by examiner

US 6,323,796 B1

DIGITAL ISOLATION SYSTEM WITH ADC OFFSET CALIBRATION

This is a continuation-in-part of U.S. Ser. Nos. 08/841, 409, 08/837,702 now U.S. Pat. No. 5,807,046 and 08/837, 714 all filed on Apr. 22, 1997. Further, the following U.S. patent applications filed concurrently herewith Ser. No. 09/034,687, entitled "Digital Isolation System With Data Scrambling" by Andrew W. Krone et al.; Ser. No. 09/034, 455, entitled "Ring-Detect Interface Circuitry and Method for a Communication System" by Timothy J. Dupuis et al.; Ser. No. 09/035,779, entitled "Call Progress Monitor Circuitry and Method for a Communication System" by Timothy J. Dupuis et al.; Ser. No. 09/034,683, entitled "External Resistor and Method to Minimize Power Dissipation in DC Holding Circuitry for a Communication System" by Jeffrey W. Scott et al.; Ser. No. 09/034,620, entitled "Caller ID Circuit Powered Through Hookswitch Devices" by Jeffrey W. Scott et al.; Ser. No. 09/034,682, entitled "Framed Delta Sigma Data With Unlikely Delta Sigma Data Patterns" by Andrew W. Krone et al.; and Ser. No. 09/035,175, entitled "Direct Digital Access Arrangement Circuitry and Method for Connecting to Phone Lines" Jeffrey W. Scott et al., are expressly incorporated herein by reference.

TECHNICAL FIELD OF THE INVENTION

This invention relates to the field of isolation systems for use in selectively isolating electrical circuits from one another. More particularly, this invention relates to digital isolation systems including analog-to-digital converter (ADC) offset calibration systems.

BACKGROUND

Electrical isolation barriers can be identified in many industrial, medical and communication applications where it is necessary to electrically isolate one section of electronic circuitry from another electronic section. In this context isolation exists between two sections of electronic circuitry if a large magnitude voltage source, typically on the order of one thousand volts or more, connected between any two circuit nodes separated by the barrier causes less than a minimal amount of current flow, typically on the order of ten milliamperes or less, through the voltage source. An electrical isolation barrier must exist, for example, in communication circuitry which connects directly to the standard two-wire public switched telephone network and that is powered through a standard residential wall outlet. Specifically, in order to achieve regulatory compliance with Federal Communications Commission Part 68, which governs electrical connections to the telephone network in order to prevent network harm, an isolation barrier capable of withstanding 1000 volts rms at 60 Hz with no more than 10 milliamps current flow, must exist between circuitry directly connected to the two wire telephone network and circuitry directly connected to the residential wall outlet.

In many applications there exists an analog or continuous time varying signal on one side of the isolation barrier, and the information contained in that signal must be communicated across the isolation barrier. For example, common telephone network modulator/demodulator, or modem, circuitry powered by a residential wall outlet must typically transfer an analog signal with bandwidth of approximately 4 kilohertz across an isolation barrier for transmission over the two-wire, public switched telephone network. The isolation method and associated circuitry must provide this communication reliably and inexpensively. In this context, the transfer of information across the isolation barrier is considered reliable only if all of the following conditions apply: the isolating elements themselves do not significantly distort the signal information, the communication is substantially insensitive to or undisturbed by voltage signals and impedances that exist between the isolated circuitry sections and, finally, the communication is substantially insensitive to or undisturbed by noise sources in physical proximity to the isolating elements.

High voltage isolation barriers are commonly implemented by using magnetic fields, electric fields, or light. The corresponding signal communication elements are transformers, capacitors and opto-isolators. Transformers can provide high voltage isolation between primary and secondary windings, and also provide a high degree of rejection of lower voltage signals that exist across the barrier, since these signals appear as common mode in transformer isolated circuit applications. For these reasons, transformers have been commonly used to interface modem circuitry to the standard, two-wire telephone network. In modem circuitry, the signal transferred across the barrier is typically analog in nature, and signal communication across the barrier is supported in both directions by a single transformer. However, analog signal communication through a transformer is subject to low frequency bandwidth limitations, as well as distortion caused by core nonlinearities. Further disadvantages of transformers are their size, weight and cost.

The distortion performance of transformer coupling can be improved while reducing the size and weight concerns by using smaller pulse transformers to transfer a digitally encoded version of the analog information signal across the isolation barrier, as disclosed in U.S. Pat. No. 5,369,666, "MODEM WITH DIGITAL ISOLATION" (incorporated herein by reference). However, two separate pulse transformers are disclosed for bidirectional communication with this technique, resulting in a cost disadvantage. Another disadvantage of transformer coupling is that additional isolation elements, such as relays and opto-isolators, are typically required to transfer control signal information, such as phone line hookswitch control and ring detect, across the isolation barrier, further increasing the cost and size of transformer-based isolation solutions.

Because of their lower cost, high voltage capacitors have also been commonly used for signal transfer in isolation system circuitry. Typically, the baseband or low frequency analog signal to be communicated across the isolation barrier is modulated to a higher frequency, where the capacitive isolation elements are more conductive. The receiving circuitry on the other side of the barrier demodulates the signal to recover the lower bandwidth signal of interest. For example, U.S. Pat. No. 5,500,895, "TELEPHONE ISOLATION DEVICE" (incorporated herein by reference) discloses a switching modulation scheme applied directly to the analog information signal for transmission across a capacitive isolation barrier. Similar switching circuitry on the receiving end of the barrier demodulates the signal to recover the analog information. The disadvantage of this technique is that the analog communication, although differential, is not robust. Mismatches in the differential components allow noise signals, which can capacitively couple into the isolation barrier, to easily corrupt both the amplitude and timing (or phase) of the analog modulated signal, resulting in unreliable communication across the barrier. Even with perfectly matched components, noise signals can couple preferentially into one side of the differential communication channel. This scheme also requires separate isolation components for control signals, such as hookswitch control and ring detect, which increase the cost and complexity of the solution.

The amplitude corruption concern can be eliminated by other modulation schemes, such as U.S. Pat. No. 4,292,595, "CAPACITANCE COUPLED ISOLATION AMPLIFIER AND METHOD," which discloses a pulse width modulation scheme; U.S. Pat. No. 4,835,486 "ISOLATION AMPLIFIER WITH PRECISE TIMING OF SIGNALS COUPLED ACROSS ISOLATION BARRIER," which discloses a voltage-to-frequency modulation scheme; and U.S. Pat. No. 4,843,339 "ISOLATION AMPLIFIER INCLUDING PRECISION VOLTAGE-TO-DUTY CYCLE CONVERTER AND LOW RIPPLE, HIGH BANDWIDTH CHARGE BALANCE DEMODULATOR," which discloses a voltage-to-duty cycle modulation scheme. (All of the above-referenced patents are incorporated herein by reference.) In these modulation schemes, the amplitude of the modulated signal carries no information and corruption of its value by noise does not interfere with accurate reception. Instead, the signal information to be communicated across the isolation barrier is encoded into voltage transitions that occur at precise moments in time. Because of this required timing precision, these modulation schemes remain analog in nature. Furthermore, since capacitively coupled noise can cause timing (or phase) errors of voltage transitions in addition to amplitude errors, these modulation schemes remain sensitive to noise interference at the isolation barrier.

Another method for communicating an analog information signal across an isolation barrier is described in the Silicon Systems, Inc. data sheet for product number SSI73D2950. (See related U.S. Pat. No. 5,500,894 for "TELEPHONE LINE INTERFACE WITH AC AND DC TRANSCONDUCTANCE LOOPS" and U.S. Pat. No. 5,602,912 for "TELEPHONE HYBRID CIRCUIT", both of which are incorporated herein by reference.) In this modem chipset, an analog signal with information to be communicated across an isolation barrier is converted to a digital format, with the amplitude of the digital signal restricted to standard digital logic levels. The digital signal is transmitted across the barrier by means of two, separate high voltage isolation capacitors. One capacitor is used to transfer the digital signal logic levels, while a separate capacitor is used to transmit a clock or timing synchronization signal across the barrier. The clock signal is used on the receiving side of the barrier as a timebase for analog signal recovery, and therefore requires a timing precision similar to that required by the analog modulation schemes. Consequently one disadvantage of this approach is that noise capacitively coupled at the isolation barrier can cause clock signal timing errors known as jitter, which corrupts the recovered analog signal and results in unreliable communication across the isolation barrier. Reliable signal communication is further compromised by the sensitivity of the single ended signal transfer to voltages that exist between the isolated circuit sections. Further disadvantages of the method described in this data sheet are the extra costs and board space associated with other required isolating elements, including a separate high voltage isolation capacitor for the clock signal, another separate isolation capacitor for bidirectional communication, and opto-isolators and relays for communicating control information across the isolation barrier.

Opto-isolators are also commonly used for transferring information across a high voltage isolation barrier. Signal information is typically quantized to two levels, corresponding to an "on" or "off" state for the light emitting diode (LED) inside the opto-isolator. U.S. Pat. No. 5,287,107 "OPTICAL ISOLATION AMPLIFIER WITH SIGMA-DELTA MODULATION" (incorporated herein by reference) discloses a delta-sigma modulation scheme for two-level quantization of a baseband or low frequency signal, and subsequent communication across an isolation barrier through opto-isolators. Decoder and analog filtering circuits recover the baseband signal on the receiving side of the isolation barrier. As described, the modulation scheme encodes the signal information into on/off transitions of the LED at precise moments in time, thereby becoming susceptible to the same jitter (transition timing) sensitivity as the capacitive isolation amplifier modulation schemes.

Another example of signal transmission across an optical isolation barrier is disclosed in U.S. Pat. No. 4,901,275 "ANALOG DATA ACQUISITION APPARATUS AND METHOD PROVIDED WITH ELECTRO-OPTICAL ISOLATION" (incorporated herein by reference). In this disclosure, an analog-to-digital converter, or ADC, is used to convert several, multiplexed analog channels into digital format for transmission to a digital system. Opto-isolators are used to isolate the ADC from electrical noise generated in the digital system. Serial data transmission across the isolation barrier is synchronized by a clock signal that is passed through a separate opto-isolator. The ADC timebase or clock, however, is either generated on the analog side of the barrier or triggered by a software event on the digital side of the barrier. In either case, no mechanism is provided for jitter insensitive communication of the ADC clock, which is required for reliable signal reconstruction, across the isolation barrier. Some further disadvantages of optical isolation are that opto-isolators are typically more expensive than high voltage isolation capacitors, and they are unidirectional in nature, thereby requiring a plurality of opto-isolators to implement bidirectional communication.

It is recognized by those skilled in the art that ADC's, such as may be useful in digital isolation systems, may produce inherent offset signals due to minor differences in component geometries and process variations. That is, if a "zero" signal is provided at the input of an ADC, a non-zero output may be generated by the ADC. The amount of offset will vary from one ADC to another, because the offset is often due to random variations in the devices. It is desirable to provide a mechanism for calibrating the isolation system circuitry to remove the ADC offset, and it is further desirable for that mechanism to operated automatically without requiring any intervention by the user of the circuit.

Thus, there exists an unmet need for a reliable, accurate and inexpensive apparatus for effecting bidirectional communication of both analog signal information and control information across a high voltage isolation barrier, while avoiding the shortcomings of the prior art.

SUMMARY OF THE INVENTION

In one aspect, the invention provides a delta-sigma analog-to-digital converter (ADC) offset calibration system in a digital capacitive isolation system having a powered circuit on a first side of a capacitive isolation barrier and an isolated circuit on a second side of the barrier, wherein digital signals are transmitted across the isolation barrier, and wherein an ADC requiring calibration is located on the second side of the isolation barrier, the ADC offset calibration system comprising a digital integrator connected to receive an output signal from the ADC and to provide an integrated offset calibration signal; a data register connected to receive and hold the integrated offset calibration signal, the data register outputting a held offset calibration signal;

and a digital to analog converter having an input connected to receive the held offset calibration signal and having an output providing an analog offset calibration signal; wherein the analog offset calibration signal is connected to an input of the ADC requiring calibration.

In another aspect, the invention provides a method of performing analog-to-digital converter (ADC) offset calibration in a digital capacitive isolation system, comprising maintaining a data input signal into the ADC being calibrated at a level of zero; integrating an output signal from the ADC to provide an integrated offset calibration signal; holding the integrated offset calibration signal in a data register; converting the integrated offset calibration signal from a digital signal to an analog offset calibration signal using a digital to analog converter (DAC); adding the analog offset calibration signal to said data input signal; and latching the integrated offset calibration signal in the data register when the output signal from the ADC becomes zero.

DESCRIPTION OF THE DRAWINGS

So that the manner in which the herein described advantages and features of the present invention, as well as others which will become apparent, are attained and can be understood in detail, more particular description of the invention summarized above may be had by reference to the embodiments thereof which are illustrated in the appended drawings, which drawings form a part of this specification.

It is noted, however, that the appended drawings illustrate only exemplary embodiments of the invention and are therefore not to be considered limiting of its scope, for the invention may admit to other equally effective embodiments.

DESCRIPTION OF PREFERRED EMBODIMENTS

Figure 1:
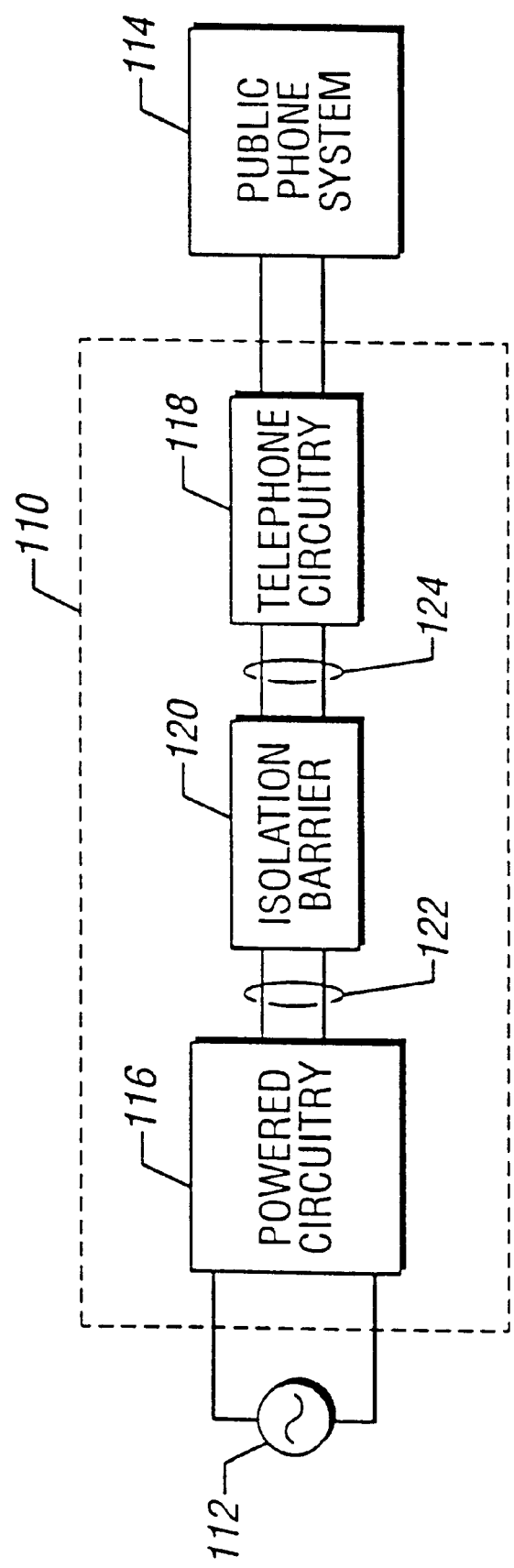
FIG. 1 is a block diagram of a telephone set illustrating a typical application of the present invention.

In order to provide a context for understanding this description, FIG. 1 illustrates a typical application for the present invention: a telephone that includes circuitry powered by a source external to the phone system. A basic telephone circuit 118 is powered by the "battery" voltage that is provided by the public telephone system and does not have a separate power connection. Many modem phones 110, however, include radio (cordless), speakerphone, or answering machine features that require an external source of power 112, typically obtained by plugging the phone (or a power supply transformer/rectifier) into a typical 110-volt residential wall outlet. In order to protect public phone system 114 (and to comply with governmental regulations), it is necessary to isolate "powered circuitry" 116 that is externally powered from "isolated circuitry" 118 that is connected to the phone lines, to prevent dangerous or destructive voltage or current levels from entering the phone system. (Similar considerations exist in many other applications as well, including communication, medical and instrumentation applications in which this invention may be beneficially applied.) The required isolation is provided by isolation barrier 120. The signal that passes through the isolation barrier 120 is an analog voice signal in a typical telephone application, but it may also be a digital signal or a multiplexed signal with both analog and digital components in various applications. In some applications, communication across isolation barrier 120 may be unidirectional (in either direction), but in many applications, including telephony, bidirectional communication is required. Bidirectional communication may be provided using a pair of unidirectional isolator channels, or by forming a single isolation channel and multiplexing bidirectional signals through the channel.

The primary requirements placed on isolation barrier 120 are that it effectively prevents harmful levels of electrical power from passing across it, while accurately passing the desired signal from the powered side 122 to the isolated side 124, or in the reverse direction if desired.

Figure 2:
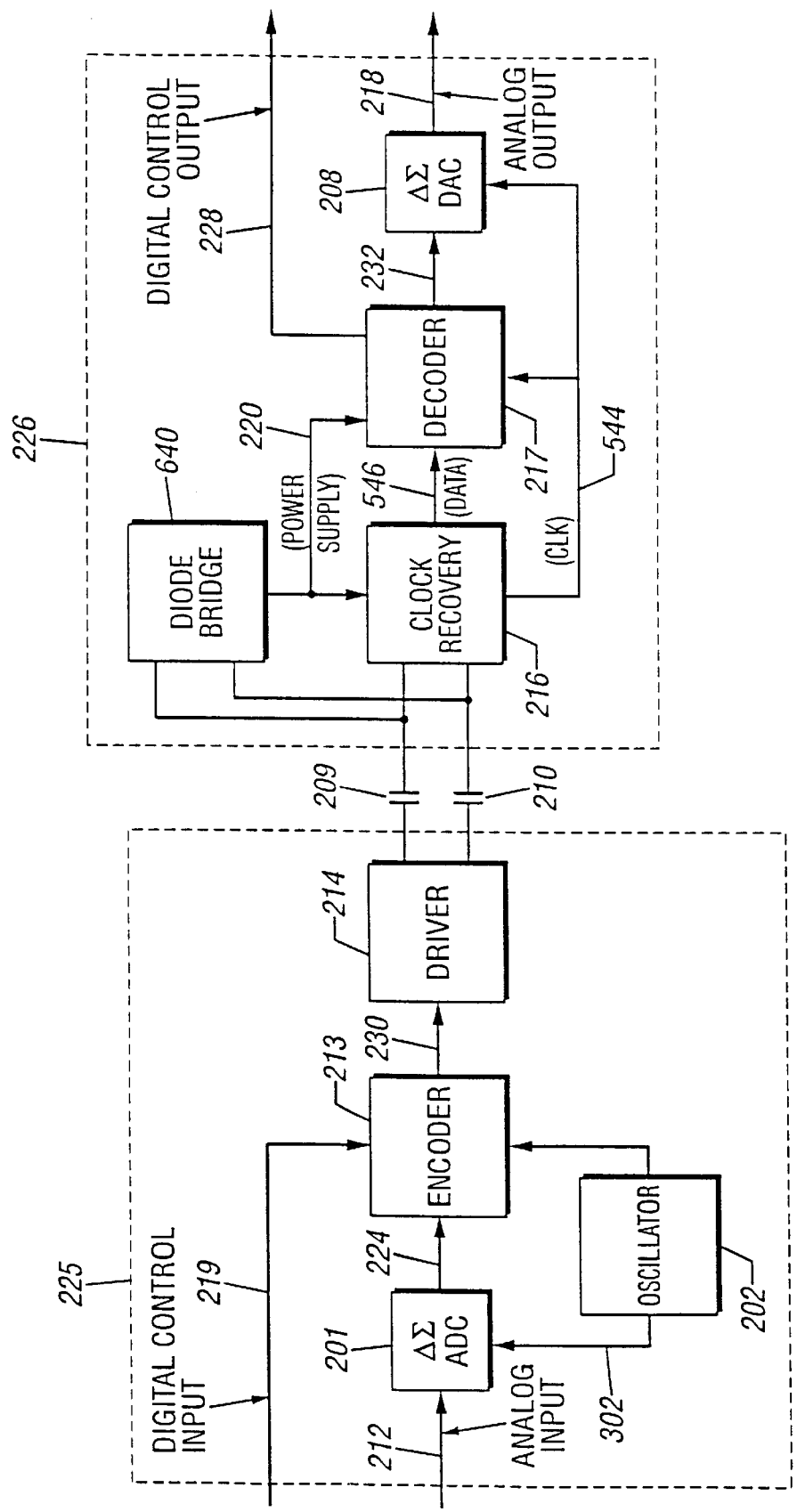
FIG. 2 is a block diagram showing a unidirectional isolation system according to the present invention.

FIG. 2 illustrates a basic block diagram of a preferred embodiment of the present invention. First the overall operation of the invention will be described, and then each component will be described in detail to the extent required to enable a person skilled in the art to make and use the invention. As a matter of terminology, the circuitry shown on the left or powered side of the isolation barrier (capacitors 209 and 210 in FIG. 2) will be referred to as the "powered" circuitry or the "transmit" circuitry or system, and the circuitry on the right side of the isolation barrier will be referred to as the "isolated" or "receive" circuitry or system. The "transmit" side can ordinarily be identified by the location of the dominant master oscillator 202 on that side of the barrier, and the slave oscillator (e.g. clock recovery circuit 216) is located on the receive side. Note, however, that in some embodiments of the present invention signals may be transmitted from the receive system to the transmit system, so these terms do not necessarily indicate the direction of data flow across the barrier. Furthermore, in some embodiments the master oscillator may be on the low-power (e.g. telephone system) side of the barrier, and a clock recovery PLL may be located on the high-power side of the barrier.

Referring to FIG. 2, a preferred unidirectional capacitive isolation system according to the present invention includes a delta-sigma analog to digital converter 201 operable on the analog input 212 and driven by a clock signal from oscillator 202. The digital output of the delta-sigma ADC 224 is synchronous with the operating frequency of oscillator 202 and time division multiplexed with digital control signals 219 by encoder circuit 213. The encoder circuit 213 also formats the resulting digital data stream 230 into a coding scheme or framing format that allows for robust clock recovery on the receiving side of the isolation barrier. The isolation barrier comprises two high voltage capacitors 209 and 210. In one embodiment of the present invention, driver circuit 214 drives the transmit side of capacitor 209 with a digital voltage signal. Clock recovery circuit 216 presents a very high impedance to the receive side of capacitor 209, allowing the digital voltage output of driver 214 to couple across the isolation barrier. In this embodiment, capacitor 210 provides a return current path across the barrier. In another embodiment, capacitors 209, 210 are differentially driven by complementary digital outputs of driver circuit 214. In that embodiment, clock recovery circuit 216 presents a very high impedance to the receive sides of capacitors 209 and 210, allowing the differential digital voltage outputs of driver 214 to couple across the isolation barrier. The input to driver circuit 214 is the output 230 of encoder 213.

The receive side of the isolation barrier includes clock recovery circuit 216, with inputs connected to isolation capacitors 209 and 210. The clock recovery circuit recovers a clock signal from the digital data driven across the isolation barrier. The recovered clock provides clocking signals for decoder 217 and delta-sigma digital-to-analog converter 208. Decoder circuit 217 separates the time division multiplexed data signal from control signals, providing a digital control output 228 and data output 232 that is routed to delta-sigma DAC 208. The delta-sigma DAC 208, with digital input supplied from decoder 217 and clock supplied from clock recovery circuit 216, provides the analog output of the receive side of the isolation system, which closely corresponds to the original analog input 212.

Active diode bridge circuit 640 may also be connected to isolation capacitors 209 and 210 to provide a DC voltage source 220 to clock recovery circuit 216 and decoder circuit 217 derived from energy contained in the signal transmitted across the isolation barrier.

In the descriptions of preferred embodiments that follow, all circuit references are made with respect to MOS (metal oxide-semiconductor) integrated circuit technology, although the invention may be implemented in other technologies as well, as will be understood by one skilled in the art. A preferred embodiment incorporates transmit system 225 consisting of delta-sigma ADC 201, oscillator 202, encoder 213 and driver 214 fabricated on one silicon substrate, and receive system 226 consisting of clock recovery circuit 216, decoder 217, delta-sigma DAC 208 and active diode bridge 640 fabricated on a second silicon substrate. The two separate silicon substrates are required to maintain the high voltage isolation provided by capacitors 209 and 210, since typical MOS technologies cannot provide high voltage isolation of 1000 volts or greater.

The delta-sigma analog-to-digital converter, shown as block 201 of FIG. 2, is well known in the art. See, for example, J. C. Candy, *A Use of Double Integration in Sigma Delta Modulation*, IEEE Trans. On Communication, March 1985, pp. 249–258, and B. E. Boser and B. A. Wooley, *The Design of Sigma-Delta Modulation Analog-to-Digital Converters*, IEEE Journal Solid State Circuits, December 1988, pp. 1298–1308, both of which are incorporated herein by reference. The specific design of ADC 201 will be a matter of design choice depending upon the needs of the particular application in which the isolation barrier will be used.

The use of a delta-sigma converter within the isolation system provides several desirable features. It will be appreciated that the delta-sigma converter uses a high oversampling rate to provide accurate A/D conversion over the input signal bandwidth without the use of precisely matched components or high-order, analog anti-aliasing filters. Moreover, such converters occupy a relatively small amount of space on an integrated circuit and are relatively easy to fabricate on a CMOS chip.

The digital pulse stream 224 output from delta-sigma converter 201 encodes the analog input signal 212 in a pulse density modulation format. In pulse density modulation, the amplitude information of the analog input signal is contained in the density of output pulses generated during a given interval of time.

Figure 3A:
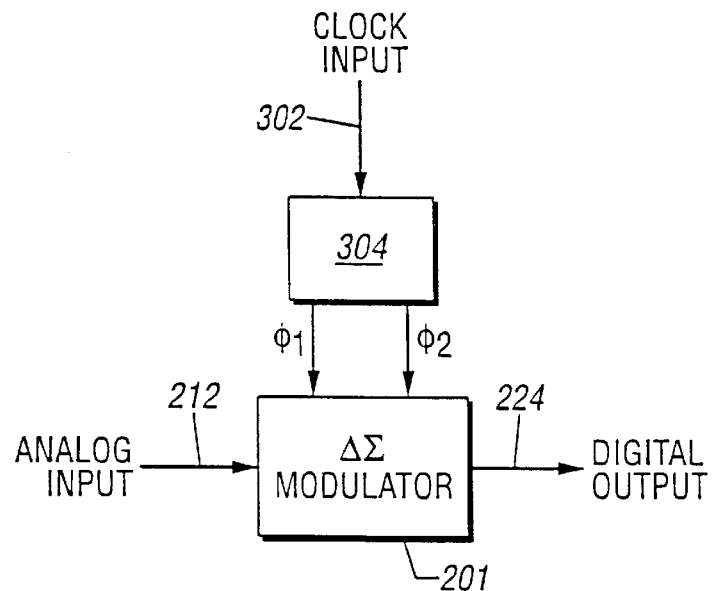
FIG. 3A is a block diagram detailing the circuitry used to provide a two-phase, non-overlapping clock signal to the delta-sig,ma modulators that are used in preferred embodiments of this invention.

Suitable designs for oscillator circuit 202 are well known in the art and may typically comprise a ring oscillator, relaxation oscillator, or an oscillator based on a piezo-electric crystal disposed external to the integrated MOS circuit. See, for example, A. B. Grebene, *Bipolar and MOS Analog Integrated Circuit Design*, John Wiley and Sons, 1984, which is incorporated herein by reference. FIG. 3A further illustrates the clock signals that may be provided to delta-sigma converter 201 in a preferred embodiment of this invention. Clock signal 302 from oscillator 202 is input to clock divider circuit 304 that divides the frequency of the input clock and provides an output in the form of two phase, non-overlapping clock signals $\emptyset_1$ and $\emptyset_2$ to the delta-sigma modulator circuit. The design and construction of clock divider circuit 304 is within the ordinary skill in the art and is not detailed here. Since encoder circuit 213 may perform time-division multiplexing of the digitized data signal 224 with digital control input data 219 using a time base derived from oscillator 202, clock divider 304 of FIG. 3A must typically divide the frequency of oscillator 202 by at least a factor of two.

Figure 3B:
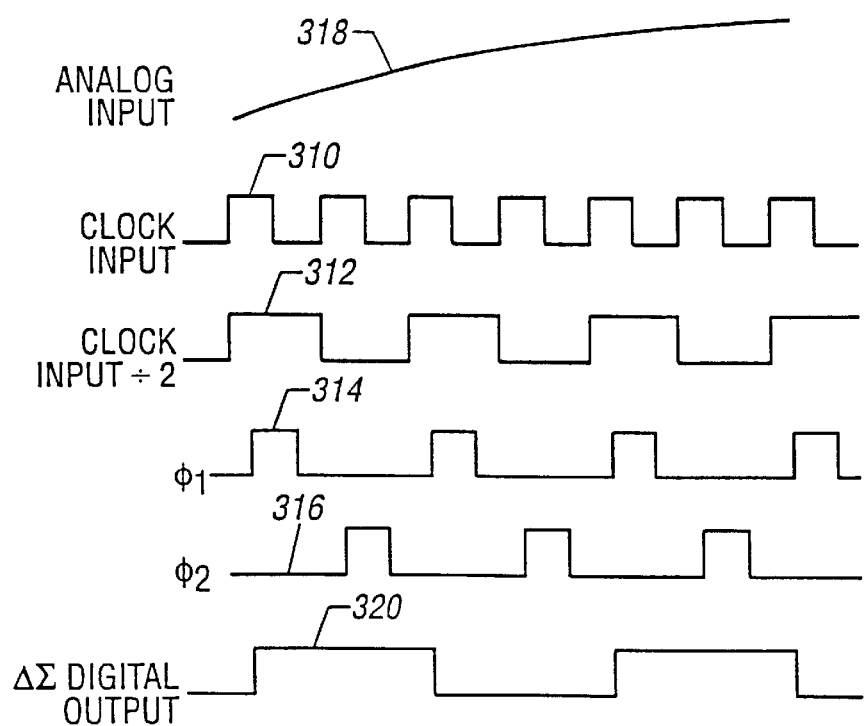
FIG. 3B is a timing diagram that illustrates timing relationships between various clock and data signals that occur in the circuitry of the present invention.

FIG. 3B illustrates exemplary signals associated with clock divider circuit 304 and delta-sigma modulator 201 in FIG. 3A. Trace 310 is the clock signal received from oscillator 202 on line 302. Trace 312 is the "clock divided by 2" signal that is generated by clock divider circuit 304. Traces 314 and 316 illustrate exemplary two phase, non-overlapping clock signals $\emptyset_1$ and $\emptyset_2$, respectively, that may be output from clock divider circuit 304 to delta-sigma modulator 201. Trace 318 represents the analog input to ADC 201, which generally changes very slowly in comparison to the frequency of clock signal 310. This bandwidth relationship is required because the delta-sigma modulator must operate at a sampling rate much higher than a typical Nyquist rate (for example, a 1 MHz sampling rate for a 4 kHz voiceband signal is typical) in order for the information in the analog signal to be accurately represented by the single-bit binary output. Finally, trace 320 represents the digital output of delta-sigma modulator 201, which may, for example, be synchronized to the rising edge of clock signal $\emptyset_1$. (The illustrated output bit pattern 320 is provided to show exemplary timing relationships and does not attempt to accurately reflect the illustrated analog input 318).

Figure 4A:
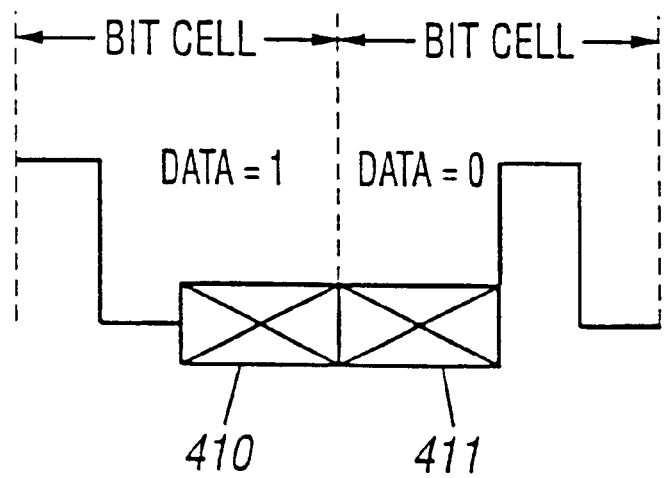
FIGS. 4A and 4B are diagrams that illustrate signal formats that may be produced by the encoders used in this invention.

Referring to FIG. 2, the encoder circuit 213 performs two primary functions in preferred embodiments of this invention. The first function of encoder 213 is time-division multiplexing of control signals 219 from other circuitry and data signals 224 from the delta-sigma modulator 201, an operation that is well known in the art and subject to many suitable implementations. The multiplexing function is synchronized by clock signals from oscillator 202. The second function of encoder 213 is formatting the data for transmission across isolation capacitors 209, 210. FIG. 4 details one coding scheme that may be used to transmit digital pulses across the capacitive isolation barrier. (Another suitable coding scheme is described below with reference to FIG. 14.) FIG. 4A shows the format for data sent from the transmit circuit to the receive circuit. When data=1 for a given bit cell, the output of the encoder is high for the first quarter of the bit cell period. When data=0 for a given bit cell, the output of the encoder is high for the third quarter of the bit cell period. This coding scheme guarantees one low-to-high transition followed by one high-to-low transition for every bit cell period, independent of the data pattern. The resulting data independent transition density allows for robust clock recovery in the receiving circuitry on the other side of isolation capacitors 209, 210. Alternatively, robust clock recovery can also be achieved by use of a preamble used for frequency locking followed by a data pattern which is not of constant average frequency.

In a bidirectional system, as is described below in connection with FIG. 7, the transmit system encoder 702 and driver 703 may cooperate to provide a high-impedance tri-state output to the isolation capacitor 705 during either the last half of the bit cell period 410 (if transmit data=1) or the first half of the bit cell period 411 (if transmit data=0) as shown in FIG. 4A. This permits transmission of information from the receive system to the transmit system during that portion of each bit cell when the transmit driver 703 is tri-stated.

Figure 4B:
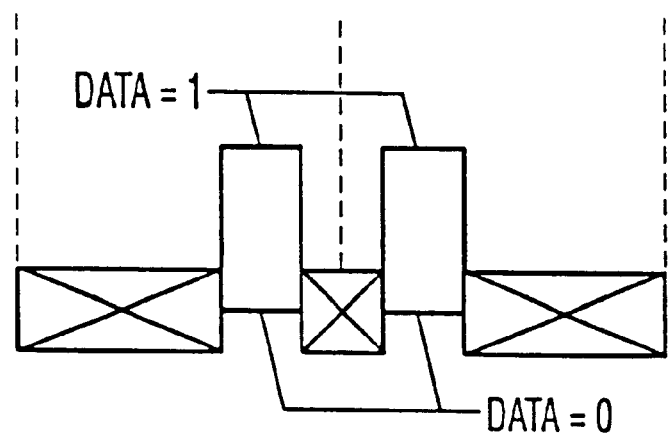

In a preferred embodiment, at the beginning of each bit cell period the receive system decoder section 708 detects whether the transmit circuit has sent a data=1 pulse across the isolation barrier. If a transmit data=1 pulse was sent, the receive driver remains tri-stated until the second half of the bit cell period, during which time a receive data=0 or 1 pulse can be sent back across the isolation barrier to the transmit system. If a transmit data=1 pulse is not detected by the receive circuit the receive driver sends receive data=0 or 1 during the first half of the bit cell period and tri-states for the second half of the bit cell period. This operation is shown in FIG. 4B.

In those embodiments in which the digital, bidirectional communication is differential, capacitors 705 and 706 are driven by complementary digital voltages in both directions, and the driver circuits associated with both capacitors are tri-stated during selected portions of the bit cell period in accordance with the coding scheme shown in FIG. 4.

Figure 13B:
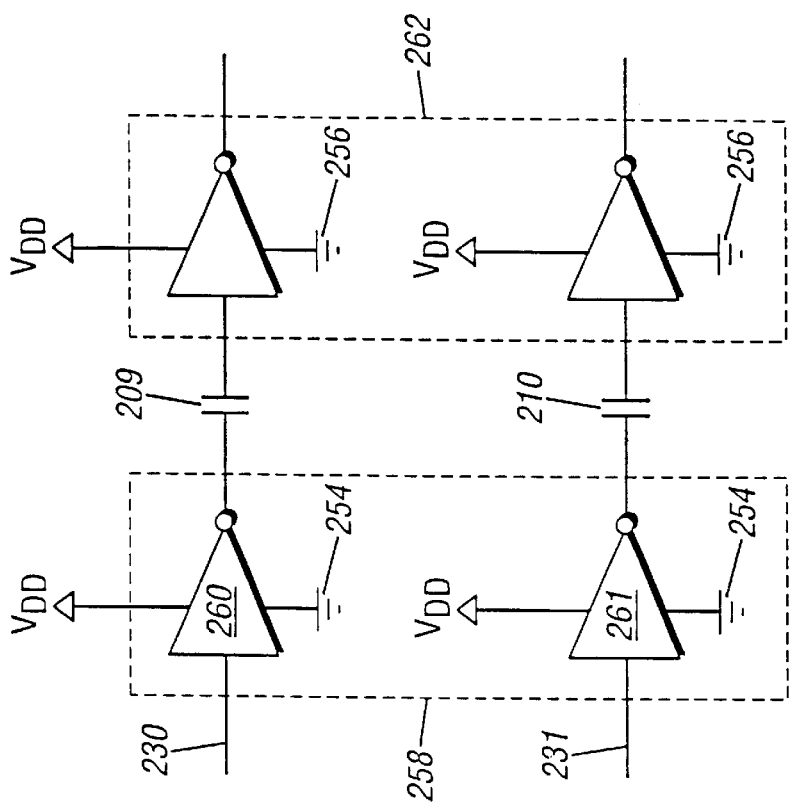
FIGS. 13A and 13B are schematic diagrams of driver circuits that may be utilized to implement the present invention.
Figure 13A:
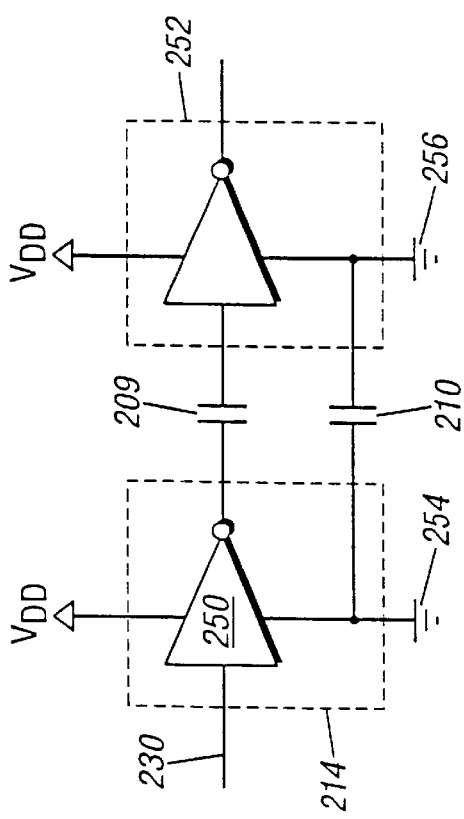

A preferred embodiment of the unidirectional driver circuit 214 of FIG. 2 is detailed in FIG. 13A for single ended (not differential) communication and FIG. 13B for differential communication across the capacitive isolation barrier. Referring to FIG. 13A, the transmit circuit driver 214 may comprise an inverter 250 driven by the encoder output signal 230. The output of inverter 250 drives the transmit circuit side of isolation capacitor 209 to transmit logic levels defined by the transmit $V_{DD}$ and ground voltage levels. The clock recovery input buffer presents a high impedance to the receive side of capacitor 209, thereby allowing the receive side of capacitor 209 to attain substantially the same logic levels as the transmit side of capacitor 209. In this manner the digital logic signal is effectively coupled across the capacitive isolation barrier.

Capacitor 210 is disposed between the transmit circuit ground node 254 and receive circuit ground node 256 in order to form a ground current return path across the isolation barrier. This path is required because the clock recovery buffer input impedance, although high, is not infinite. Therefore a small current must flow across the barrier and back in order to couple the digital logic signal across the barrier. Furthermore, capacitor 209 must deliver charge to the active diode circuit 640 (FIG. 2) in order that a supply voltage for several receive circuit sections can be provided. The current associated with this transfer of charge from the transmit circuit to the receive circuit must have a path to return to the transmit circuit.

The single-ended communication system described above is insensitive to voltage signals that may exist between the transmit circuit ground 254 and receive circuit ground 256 provided that the rate of change of such voltage signals is substantially less than the frequency of the digital signal transmitted across the barrier. The single-ended method is also insensitive to resistive and capacitive impedances that may exist between the transmit circuit ground 254 and receive circuit ground 256. The system can be desensitized to inductive impedances that may exist between the transmit circuit ground 254 and receive circuit ground 256 by adding resistive elements in series with capacitor 210, in series with the transmit ground connection 254, in series with the receive ground connection 256, or any combination of these.

FIG. 13B shows an example of a suitable differential driver 258 for unidirectional digital communication across a capacitive isolation barrier. The inverter 260 that drives capacitor 209 is driven by the digital signal output from the transmit encoder circuit 213, while inverter 261, which drives capacitor 210, is driven by the complement 231 of the digital signal output from transmit encoder circuit 213. Clock recovery input buffer 262 presents high impedances to the receive sides of capacitors 209 and 210, allowing the differential digital transmit voltages to couple across the isolation barrier. In this differential communication method, both capacitors 209 and 210 provide return current paths across the isolation barrier. The differential digital communication system described above is largely insensitive to voltage signals and impedances that may exist between the transmit circuit ground 254 and receive circuit ground 256, since these voltages and impedances appear as common mode influences in differential communication.

Bidirectional communication across the barrier can be supported by additional driver and receive buffer structures, similar to those shown in FIG. 13, without the need for any additional isolation elements, providing that inverters 250, 260, 261, which drive the high voltage isolation capacitors, can be tri-stated generally in accordance with the timing diagram shown in FIG. 4 or any other suitable coding and timing scheme. In some embodiments, additional capacitor driving inverters that can be tri-stated may be provided in a receive-side driver circuit 713 (FIG. 7) and input buffers may be provided in a transmit side decoder circuit 714.

In presently preferred embodiments, the actual isolation barrier comprises a pair of isolation capacitors 209 and 210, which are high voltage capacitors that may be chosen for a particular application to prevent DC and low frequency current flow across the barrier and protect the isolated circuitry from high voltage faults and transients, while permitting data at selected transmission frequencies to cross the barrier. The capacitors must be capable of withstanding anticipated voltages that may appear due to faults in the powered circuitry 225, in order to provide the protective function that is the purpose of the barrier. For example, in preferred embodiments ordinary 2000 volt capacitors with capacitance on the order of 100 pF may be utilized in the isolation barrier. In a barrier system in accordance with the present invention it is not necessary to use high precision capacitors, because the system is very tolerant of variations in capacitor performance due to environmental influences, such as variations in voltage and temperature.

Figure 5:
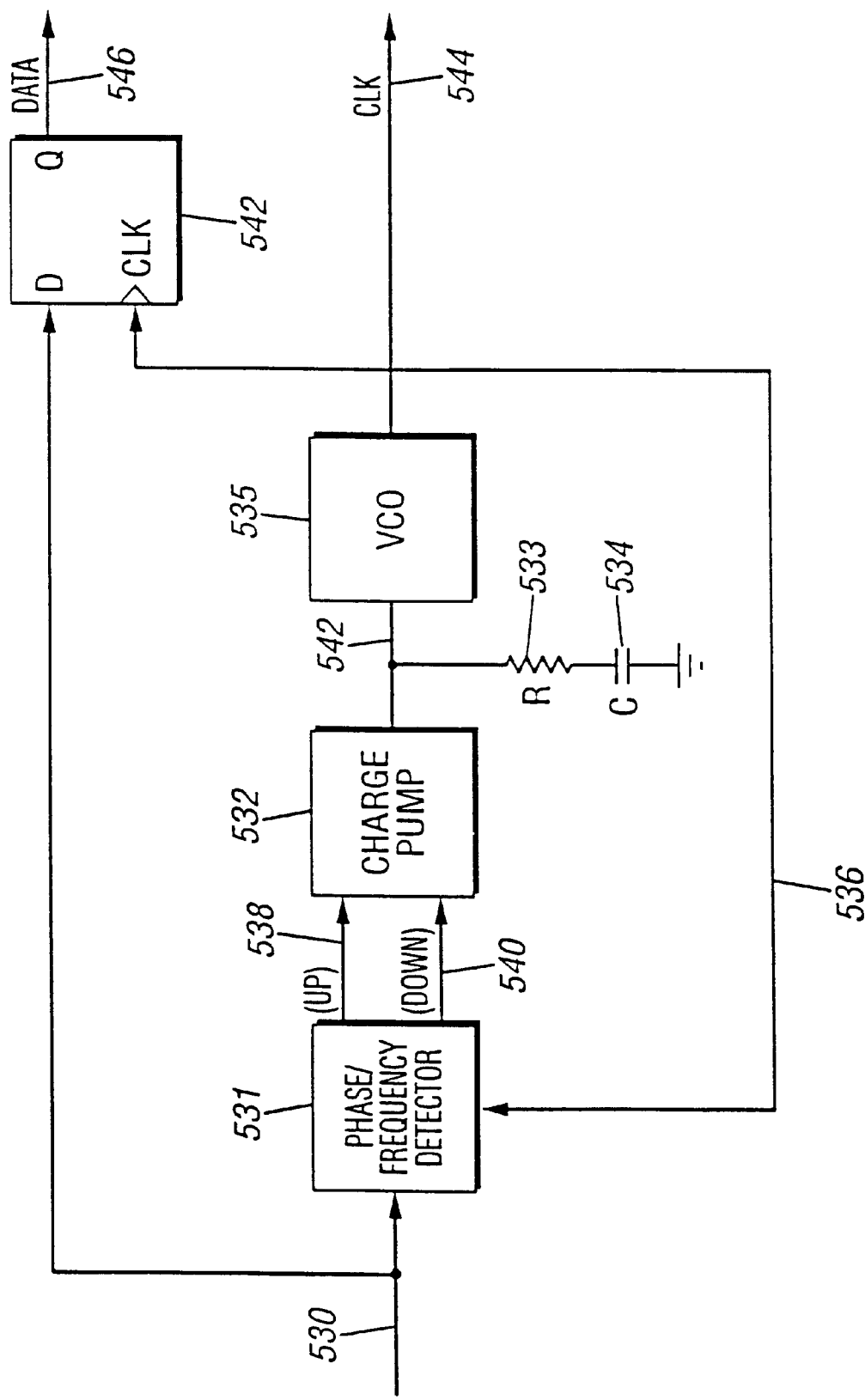
FIG. 5 is a block diagram showing the components of exemplary clock recovery circuit that is used in the present invention.

A preferred embodiment for a clock recovery circuit 216 for use in this invention is detailed in FIG. 5 and described below. One section of the clock recovery circuit may be a phase locked loop ("PLL") circuit, consisting of phase/frequency detector 531, charge pump 532, resistor 533, capacitor 534, and voltage controlled oscillator ("VCO") 535. The other section of the clock recovery block is data latch 542 operating outside the phase locked loop to re-time the digital data received across the isolation barrier. Circuitry for performing these functions is well known to those skilled in the art. See, for example, F. Gardner, *Phaselock Techniques*, 2d ed., John Wiley & Sons, NY, 1979; and R. Best, *Phase-Locked Loops*, McGraw-Hill, 1984, which are incorporated herein by reference. The data input to the receive system from the isolation capacitors may be derived from a differential signal present at the barrier by passing the differential signal through MOS input buffers (not shown), which are well known in the art, and providing a single-ended binary output signal 530 to the clock recovery circuit.

The illustrated exemplary phase/frequency detector 531 receives a digital input 530 from the isolation barrier and an input 536 from the output of VCO 535 and performs a phase comparison between these two inputs. If the VCO phase lags the input data phase, a speed up signal 538 is supplied to charge pump 532. If the input data 530 phase lags the VCO output 536 phase, a slow down signal 540 is supplied to charge pump 532. In response to "speed up" inputs from phase/frequency detector 531, charge pump 532 delivers a positive current to the loop filter consisting of resistor 533 and capacitor 534 connected in series. In response to "slow down" inputs from the phase/frequency detector, charge pump 532 sinks a positive current from the loop filter. The output voltage of the loop filter at node 542 drives voltage controlled oscillator 535, which increases its operation frequency as the input voltage increases. The output of VCO 535 is fed back as input 536 to phase/frequency detector 531, and it is also used to re-time the input data 530 by serving as the clock input to flip-flop latch 542, thus providing a clock signal to the isolated circuitry and also providing data signal 546 that is synchronized to clock signal 544. A divider circuit may be included in the feedback path 536.

The phase/frequency detector and charge pump operate to increase loop filter voltage 542 and VCO frequency if VCO phase 536 lags input data phase 530. Conversely, the VCO frequency is decreased if the VCO phase leads input data phase. In this manner, the VCO output phase is adjusted until phase lock is achieved with input data. Consequently, the VCO frequency is driven to be substantially identical to the input data frequency.

If noise interference occurs at the isolation barrier, the input data transitions will occur at points in time that are noisy, or jittered, relative to the transition times of the transmit circuit driver. These jittered data edges will cause a noise component in the charge pump current that drives the loop filter. The loop filter and VCO, however, low-pass filter this noise component, substantially attenuating the effects of this input data jitter. Consequently, the VCO output signal, while frequency locked to the input data, contains substantially less phase noise than the noisy input data. The bandwidth of the phase noise filtering operation may be set independently of the bandwidth of the analog signal to be communicated across the isolation barrier. Since the filtered, phase locked loop output clock signal 544 is used to latch or re-time the noisy input data at flip flop 542, the effects of noise interference at the capacitive isolation barrier are substantially eliminated. Finally, the filtered, phase locked loop output clock signal 544 is used as the timebase or clock for the other receive circuits, including decoder 217 and delta-sigma DAC 208 shown in FIG. 2, resulting in an analog output 218 of the capacitive isolation system that is substantially free from any noise interference that may have been introduced at the capacitive isolation barrier.

Figure 6A:
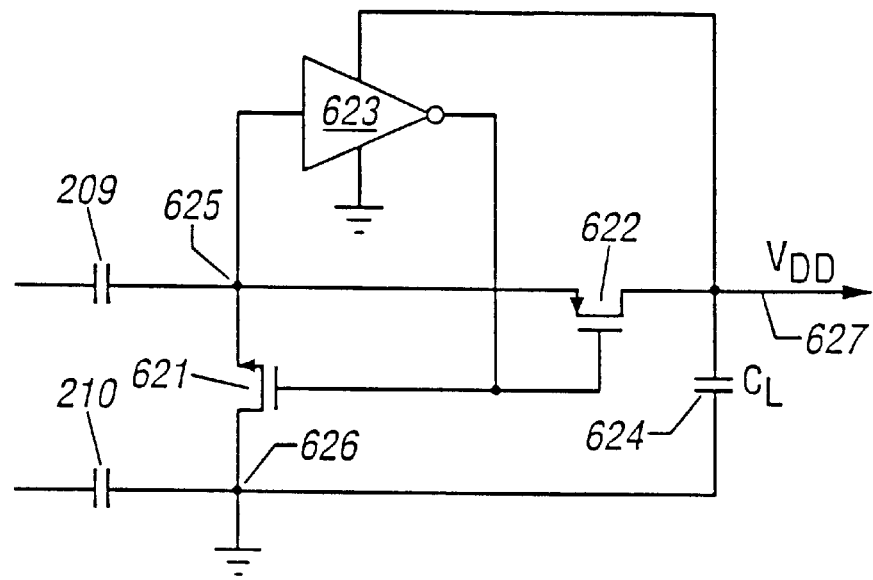
FIGS. 6A and 6B are schematic diagrams of active diode bridge circuits that may be used as power supplies in preferred embodiments of the present invention.
Figure 6B:
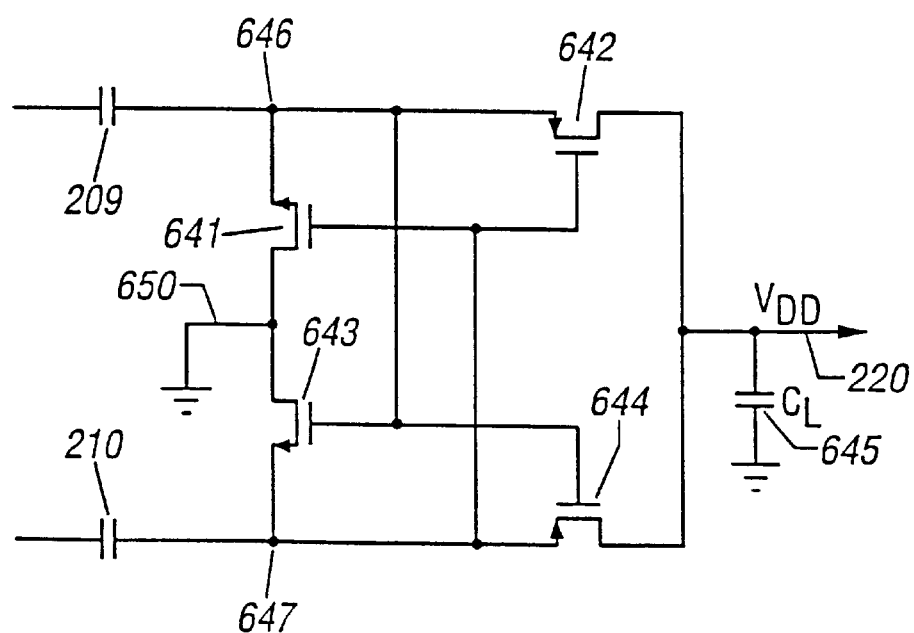

Preferred embodiments of active diode bridge circuit 640 of FIG. 2 are detailed in FIG. 6A for single-ended digital communication and FIG. 6B for differential digital communication across the isolation barrier. The active diode bridge generates a DC power supply voltage $V_{DD}$, which may be used to operate the clock recovery and receiver decoder circuits, in response to the digital data received across the capacitive isolation barrier. An active diode bridge circuit is distinguished from a standard or passive diode bridge in that the gating elements are active transistors rather than passive elements such as bipolar diodes.

Referring to the exemplary circuit illustrated in FIG. 6A, isolation capacitor 209 is connected to node 625 and isolation capacitor 210 is connected to node 626. The source of n-channel MOSFET 621 and the source of p-channel MOSFET 622 are connected to node 625. Also connected to node 625 is the input of standard CMOS inverter 623. The output of inverter 623 drives the gates of MOSFETS 621 and 622. The drain of n-channel MOSFET 621 is connected to node 626, the receive circuit ground node, while the drain of p-channel MOSFET 622 connects to node 627, which provides $V_{DD}$ voltage for the isolated circuitry. Also connected to $V_{DD}$ node 627 are load capacitor $C_L$ 624 and the power supply input of CMOS inverter 623. In a preferred embodiment, the power supply inputs of clock recovery circuit 216 and decoder circuit 217 shown in FIG. 2 are also connected to $V_{DD}$ node 627.

Referring to the exemplary embodiment illustrated in FIG. 6A, the operation of the active diode bridge circuit used in single-ended digital communication will now be described. A digital logic signal is coupled across capacitor 209 from the transmit section. When a digital "high" signal is received through capacitor 209, node 625 goes high. The logic "high" signal on node 625 forces the CMOS inverter 623 output node to go low, turning off device 621 and turning on device 622. Consequently, current flows through capacitor 209, device 622, and from $V_{DD}$ to receive circuit ground through capacitor $C_L$ and through clock recovery and decoder circuitry shown in FIG. 2. The circuit is completed by current flow returning across the isolation barrier through capacitor 210. The current demand by circuitry on $V_{DD}$ through capacitors 209 and 210 must be limited so that the voltage on node 625 relative to node 626 can still be recognized as a digital high logic level. When a digital "low" signal is received through capacitor 209, CMOS inverter 623 turns off device 622 and turns on device 621. Consequently, current flows across the isolation barrier through capacitor 210, through device 621, and returns across the isolation barrier through capacitor 209. Therefore, although no average current flows through capacitors 209 and 210, average current can be supplied from $V_{DD}$ to receive circuit ground to operate clock recovery circuit 216 and decoder circuit 217. Load capacitor 624 operates to minimize supply ripple on the DC supply voltage established on node $V_{DD}$.

Referring to the embodiment shown in FIG. 6B, isolation capacitor 209 connects to node 646 and isolation capacitor 210 connects to node 647. The source node of n-channel MOSFET 641 and the source node of p-channel MOSFET 642 connect to node 646. Also connected to node 646 are the gates of n-channel MOSFET 643 and p-channel MOSFET 644. The source node of n-channel MOSFET 643 and the source node of p-channel MOSFET 644 connect to node 647. Also connected to node 647 are the gates of n-channel MOSFET 641 and p-channel MOSFET 642. The drains of devices 641 and 643 are connected to the ground node of the receiving circuit. The drains of devices 642 and 644 are connected to the node 220, which provides $V_{DD}$ voltage for the isolated circuitry. Also connected to $V_{DD}$ node 220 are load capacitor $C_L$ 645 and the power supply inputs of clock recovery circuit 216 and decoder circuit 217 as shown in FIG. 2.

Referring to the exemplary embodiment illustrated in FIG. 6B, the operation of the active diode bridge used in differential digital communication will now be described. A differential digital signal is received through capacitors 209 and 210. When a digital 'high' signal is received through capacitor 209, a corresponding digital 'low' signal is received through capacitor 210, and node 646 goes high while node 647 goes low. This condition turns on devices 642 and 643 while turning off devices 641 and 644. Consequently, current flows through capacitor 209, device 642, from $V_{DD}$ to ground through capacitor $C_L$ and through clock recovery circuitry 216 and decoder circuitry 217 shown in FIG. 2. The circuit is completed from receive circuit ground 650, through device 643 and finally returning across the isolation barrier through capacitor 210. The current demand on $V_{DD}$ must be limited so that the voltage on node 646 relative to node 650 can be recognized as a high logic level signal by the clock recovery and decoder circuitry.

When a digital 'low' signal is received through capacitor 209, a digital 'high' signal is received through capacitor 210, and node 646 goes low while node 647 goes high. This condition turns on devices 641 and 644 while turning off devices 642 and 643. Consequently current flows through capacitor 210 and device 644 to $V_{DD}$ node 220, and from there to ground through capacitor 645 and through clock recovery and decoder circuitry shown in FIG. 2. The circuit is completed from ground 650, through device 641 and finally returning across the isolation barrier through capacitor 209. Therefore, in either logic state, and independently of the current flow direction through capacitors 209 and 210, current flows in the same direction from $V_{DD}$ to ground. Therefore, an average or DC supply voltage is established on node $V_{DD}$, and adequate current can be supplied to operate clock recovery circuit 216 and decoder circuit 217. Load capacitor 645 operates to minimize power supply ripple, providing a filtering operation on $V_{DD}$. An added benefit of the ability to power sections of the isolated circuitry from the digital signal transmitted across the capacitive isolation barrier from the powered circuitry is that it allows isolated power-up and power-down control of isolated circuitry sections on an as-needed basis.

Parasitic bipolar transistors may result from typical CMOS processes. If they are not controlled, these bipolar transistors can discharge the power supply 627 shown in FIG. 6A during the initial power up time. If the discharge current from the parasitic bipolar transistors is larger than the current delivered to the power supply 627 through transistor 622, then the circuit may not power up to the desired full voltage level. The beta of a lateral bipolar transistor in any CMOS process is a function of layout. With appropriate layout (i.e., large base region), the beta can be kept small enough to minimize undesired discharge currents. Further care needs to be taken in the design of any circuit that is connected to power supply 627. The circuits connected to power supply 627 cannot draw more current from the power supply than is available from the active diode bridge, even before the supply has ramped to the full value. Circuit design techniques to address these issues are common and well known in the art.

In the illustrative embodiment shown in FIG. 2, delta-sigma digital to analog converter (DAC) 208 receives input data from decoder 217 and synchronous clock input from clock recovery circuit 216. Analog output signal 218 is generated by DAC 208 in response to the digital data that is communicated across the capacitive isolation barrier. The output signal 218 is highly immune to amplitude and phase noise that may be introduced in the barrier circuitry because the signal that is communicated across the isolation capacitors is a synchronous digital signal, and because the received data is resynchronized to the recovered, jitter-filtered clock signal. The DAC is also timed by that clock signal. Delta-sigma DAC technology is well known in the art, and selecting a suitable DAC circuit will be a matter of routine design choice directed to the intended application of the barrier circuit. See, for example, P. Naus et al., *A CMOS Stereo 16-Bit D/A Converter for Dioital Audio*, IEEE Journal of Solid State Circuits, June 1987, pp. 390–395, which is incorporated herein by reference.

Figure 7:
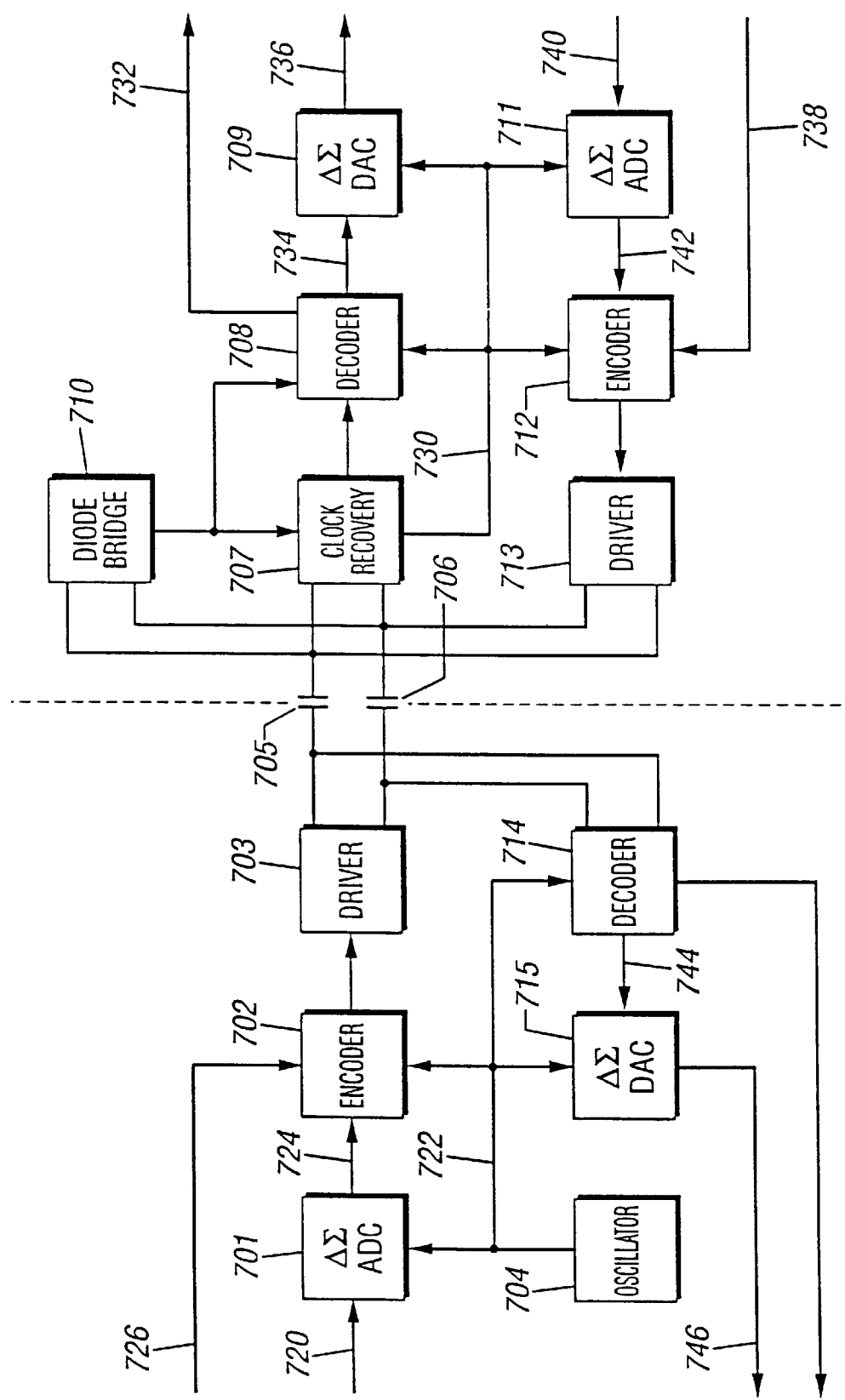
FIG. 7 is a block diagram illustrating a bidirectional isolation system according to the present invention.

FIG. 7 illustrates a preferred bidirectional embodiment of the present invention. It will be recognized that other uni-directional and bidirectional isolation barriers may be designed by persons skilled in the art using the principles described herein, and that such barriers will fall within the scope of this invention. In the illustrated and described embodiment, the capacitive isolation system comprises a "transmit" system to the left of center, a "receive" system to the right of center, and a capacitive isolation barrier in the center of the figure comprising two high voltage capacitors 705 and 706. Note that the terms "transmit" and "receive" are used to identify the powered and isolated sides of the barrier, respectively, and that in this embodiment data may be conveyed across the barrier in both directions. Many of the components in this bidirectional embodiment are identical or similar to those in the unidirectional embodiment described above with reference to FIG. 2.

The transmit system includes delta-sigma analog-to-digital converter 701 operable on the analog input 720 of the transmit circuit and synchronized to clock signal 722 from oscillator 704. The analog input 720 of the transmit system is an analog signal containing information to be transmitted across the isolation barrier, which may be for example an analog voice signal to be coupled to a telephone system. Digital output 724 of the delta-sigma ADC may be time-division multiplexed with digital control input 726 by the encoder circuit 702. Digital control input 726 is a digital signal containing additional information to be transmitted across isolation barrier 705, 706. Digital control input 726 may include control information for analog circuitry on the receiving side of the isolation barrier. Encoder circuit 702 also formats the resulting data stream into a coding scheme that allows for robust clock recovery on the receiving side of the isolation barrier, as is described above.

Encoder circuit 702 also receives a clock signal 722 from oscillator 704. Driver circuit 703 of the transmit system drives the encoded signal to isolation capacitors 705 and 706 in response to the output of encoder circuit 702.

The isolation barrier comprises two high voltage capacitors 705, 706. In one embodiment, capacitor 705 is driven bidirectionally by drivers 703, 713 while capacitor 706 provides a return path across the isolation barrier. In another embodiment of the present invention, capacitors 705 and 706 are differentially driven by digital driver circuits 703, 713.

A preferred embodiment of the receive system, shown to the right of isolation capacitors 705, 706 in FIG. 7 includes clock recovery circuit 707, whose inputs are connected to isolation capacitors 705, 706. The clock recovery circuit recovers a clock signal from the digital data driven across the isolation barrier and provides synchronized clock signal 730 to the various circuits in the receive system. The recovered clock operates as the time base for decoder 708 and delta-sigma digital-to-analog converter 709. Decoder section 708 separates the time division multiplexed data and control information, providing digital control output 732 to other circuitry, and providing synchronous data signal 734 as an input to delta-sigma DAC 709. The delta-sigma DAC 709, with digital input 734 supplied by decoder 708, and clock signal 730 supplied by clock recovery section 707, operates synchronously with the transmit system delta-sigma ADC 701 and provides analog output 736 on the receiving side of the isolation barrier. Active diode bridge 710 is connected to isolation capacitors 705 and 706 and supplies a DC power supply voltage to clock recovery circuit 707 and decoder circuit 708 by drawing current from the digital signal transmitted across the isolation barrier, as is described in detail above. Driver 713 must remain tri-stated until decoder 708 has detected a valid frame, indicating successful power-up of the receive circuit sections.

The embodiment shown in FIG. 7 also enables communication from the receive system to the transmit system, or from right to left across the isolation capacitors as illustrated. The receive system encoder circuit 712 and driver circuit 713 cooperate to communicate information back from the receive system to the decoder circuit 714 in the transmit system. Receive system encoder section 712 receives a clock input 730 from clock recovery section 707, and is thereby synchronized to the transmit system oscillator 704 and encoder 702. This synchronization allows transmission in each direction to occur in distinct time slots. In time slots where transmit driver 703 is operable to transmit information from the transmit system to the receive system, receive driver 713 is tri-stated or disabled. Alternatively, in time slots where receive driver 713 is operable to transmit information back from the receive system to the transmit system, transmit driver 703 is tri-stated or disabled. In this manner, bidirectional communication may be established across a single pair of high voltage isolation capacitors.

Digital control input 738 of the receive system is a digital signal containing information to be communicated across the isolation barrier, including control information for analog circuitry on the transmit system side of the barrier. The receive system also includes delta-sigma ADC 711 operable on analog input signal 740 so that the information contained in analog signal 740 on the receive system side of the isolation barrier can be conveyed across the barrier in digital form and then accurately reproduced on the transmit system side of the barrier. The receive system delta-sigma ADC 711 receives its clock input from clock recovery circuit 707, and is thereby synchronized with transmit system oscillator 704. Digital output signal 742 generated by receive system ADC 711 may be time-division multiplexed with receive system digital control input 738 in encoder section 712.

In the transmit system, decoder circuit 714 is connected to isolation capacitors 705, 706 to receive signals therefrom, identify signals representing information coming from the receive system. Decoder 714 then extracts the digital control information from the data stream received from the receive circuit, and passes data signal 744 generated by delta-sigma ADC 711 to transmit system delta-sigma DAC 715. Decoder 714 also latches and retimes the data received across the barrier to synchronize it with clock signal 722, which is generated by oscillator 704, thereby eliminating the effects of phase noise interference and other sources of jitter in the synchronous digital signal. Circuits that are suitable for performing these decoder functions are well known in the art.

Transmit system delta-sigma DAC 715 receives its clock input from oscillator 704 and is thereby synchronized to receive system ADC 711. Transmit system DAC 715 provides a reconstructed analog data output signal 746, thereby completing the communication of analog information back from the receive system to the transmit system.

In summary, FIG. 7 describes a bidirectional communication system for conveying analog and digital information across a capacitive isolation barrier. The barrier itself is inexpensive, since only two high voltage isolation capacitors are required for synchronous, bidirectional communication. The barrier is a reliable communication channel because the digital signals communicated across the barrier are insensitive to amplitude and phase noise interference that may be introduced at the isolation barrier.

Figure 8:
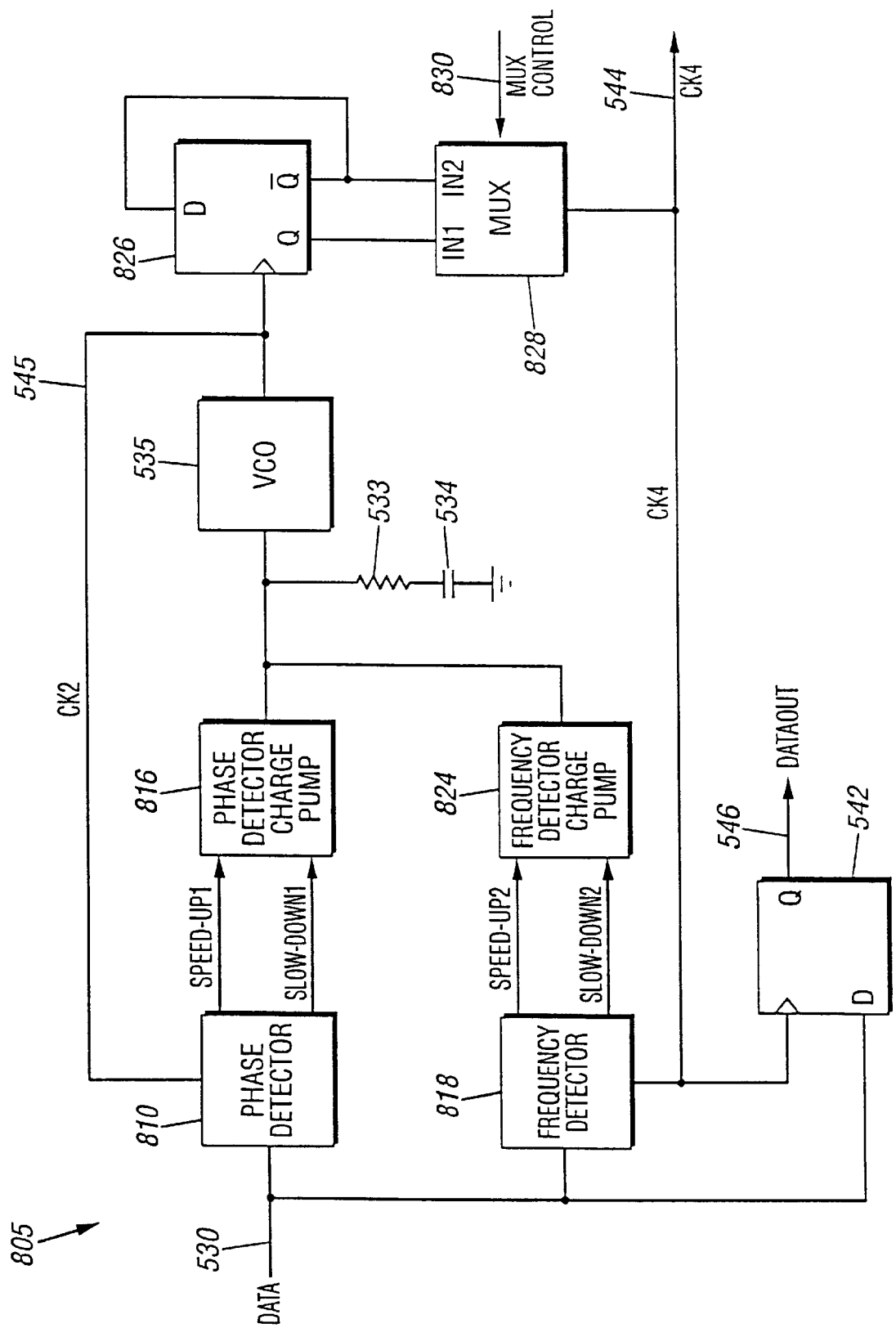
FIG. 8 is a block diagram of a clock recovery and data synchronization circuit according to a preferred embodiment of the present invention.

A more detailed description of a clock recovery circuit suitable for use in this invention with the coding scheme of FIG. 4 will now be provided, with reference to FIG. 8. Clock recovery PLL 805 has data input 530, data output 546 and recovered clock signal output 544. Phase detector 810 has inputs DATA 530 and feedback clock signal CK2 545. The outputs of phase detector 810 are SPEED-UP1 and SLOW-DOWN1 signals, both of which are connected to inputs of phase detector charge pump 816. Frequency detector 818 has inputs DATA 530 and output clock signal CK4 544. The outputs of frequency detector 818 are signals designated SPEED-UP2 and SLOW-DOWN2, which are connected to the inputs of frequency detector charge pump 824. The outputs of phase detector charge pump 816 and frequency detector charge pump 824 are connected together and are also connected to the input of voltage controlled oscillator ("VCO") 535 and one terminal of resistor 533. The other terminal of resistor 533 is connected to one terminal of capacitor 534. The other terminal of capacitor 534 is connected to ground. The output of VCO 535 is the CK2 signal 545. The clock input of flip-flop 826 is connected to CK2 545. The Q-bar output of flip-flop 826 is connected to the D input of flip-flop 826. The Q and Q-bar outputs of flip-flop 826 are connected to the inputs of multiplexer (mux) 828. The control input 830 of mux 828 is called MUX CONTROL and comes from the framing logic, which is described elsewhere in this specification. The output of mux 828 is the CK4 signal 544. The D input of flip-flop 542 is connected to data input 530. The clock input of flip-flop 542 is connected to the CK4 signal 544. The Q output of flip-flop 542 is the resynchronized DATAOUT signal 546, which is sent to the frame detect logic.

Frequency detector 818 is dominant over phase detector 810 when the frequency of the DATA and CK4 signals are different. Once the frequency of the DATA and CK4 signals are substantially similar, the SPEED-UP2 and SLOW-DOWN2 signals become inactive and phase detector 810 becomes dominant. Separate charge pumps for the phase detector and frequency detector allow for independent control of the gain of the phase detector and frequency detector circuits. Alternatively, if independent gains are not required, then the SPEED-UP1 and SPEED-UP2 signals could be logically ORed together to drive one charge pump. And likewise the SLOW-DOWN1 and SLOW-DOWN2 signals could be logically ORed together to drive the other input to the charge pump.

The output of VCO 535 is the CK2 signal, which is divided by two in frequency by flipflop 826. Since CK2 is divided by two to generate the bit rate clock signal CK4, there can be two phases of CK4 with respect to the start of a bit period. The phase of CK4 that will yield correct operation of the frequency detector is the one where the rising edge of CK4 aligns with the start of a bit period. The frame-detect logic is needed to detect the start of a bit interval and is used to select the appropriate phase of CK4 using mux 828.

Figure 15:
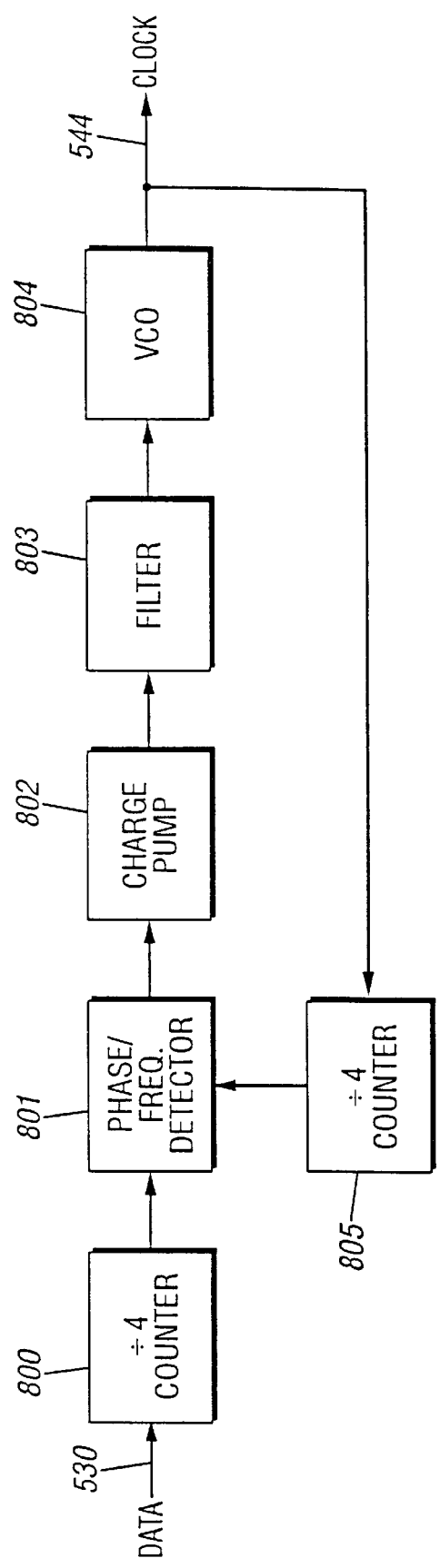
FIG. 15 is a block diagram of a clock recovery circuit that may be employed for use with the framing format of FIG. 14.

It will be appreciated that a clock recovery circuit according to this invention, such as that illustrated in FIG. 8 or FIG. 15, may be beneficially used to recover and stabilize a clock signal on the isolated side of the barrier where the clock signal is conveyed via isolation elements that are separate from the isolation elements that are used to transfer the data signal.

Figure 11:
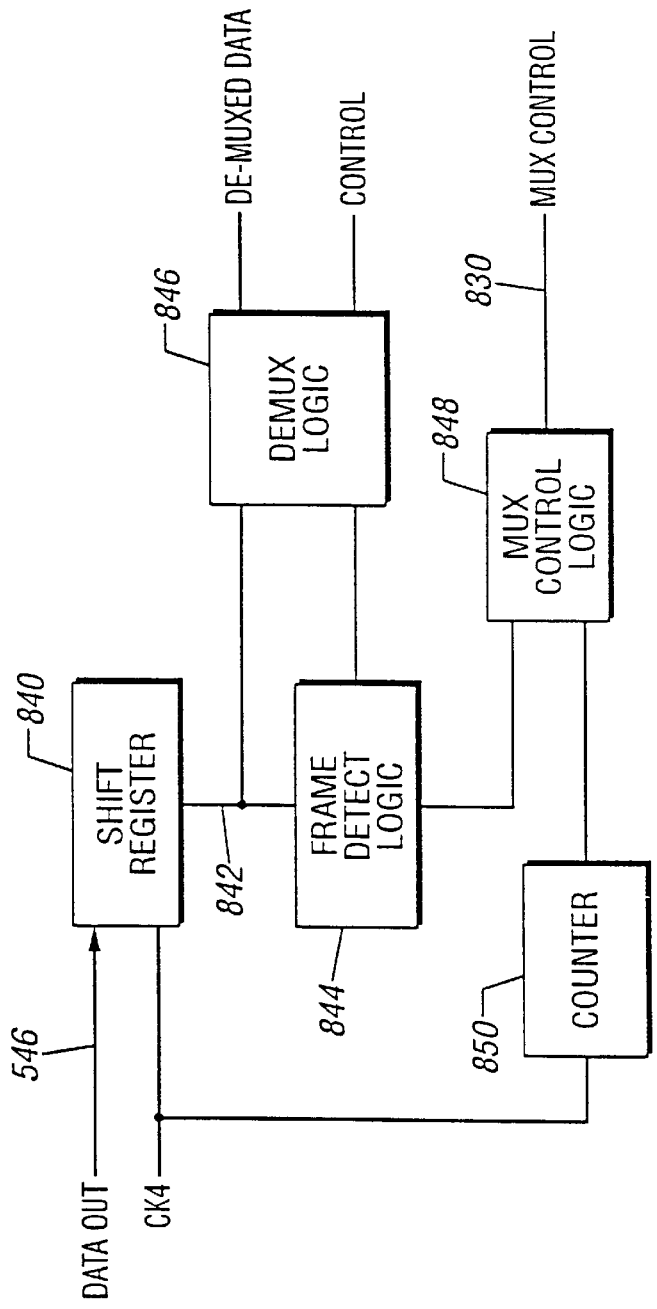
FIG. 11 is a block diagram of a decoder circuit that may be utilized in a preferred embodiment of the present invention.

A preferred embodiment of a decoder circuit 708 is shown in FIG. 11. Shift register 840 has an input connected to the DATAOUT signal 546 from clock recovery circuit 805 and is clocked by recovered clock signal CK4. Multi-bit output 842 of shift register 840 is connected to frame-detect logic 844 and to demux logic 846. Frame detect logic 844 has one output connected to mux control logic 848 and one output connected to demux logic 846. Demux logic 846 is clocked by CK4. Counter 850 is also clocked by CK4. The output of counter 850 is connected to mux control logic 848. The output of mux control logic 848 is the MUX-CONTROL signal 830 sent to the clock recovery PLL 805 to select the proper phase for the CK4 signal. The outputs of demux logic 846 are the DEMUXED DATA signal and the CONTROL signal.

Figure 12:
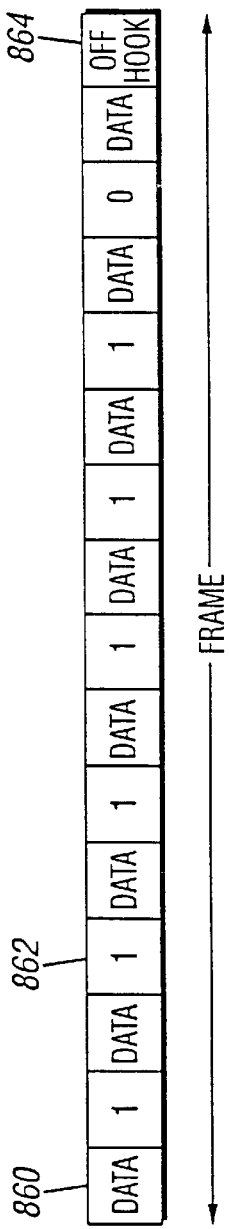
FIG. 12 is an illustration representing a framing format that may be beneficially used in preferred embodiments of the present invention.

Shift register 840 stores a predetermined number of bits of the serial DATAOUT signal 546. Frame-detect logic 844 operates on this data and detects when a frame signal is received. Many possible framing signal formats can be used. A format that may be used in a presently preferred embodiment is shown in FIG. 12. Data 860 is alternated with framing signals 862 and control signals. In the framing format shown in this figure, one control signal (off hook) 864 is sent for every eight data bits. The remaining seven bits in the frame of sixteen are used for frame synchronization. The illustrated framing signal is six ones followed by a zero in the control signal field. The data signal may be guaranteed to not have more than five ones in a row so that it will not be mistaken for a framing signal. Many other framing formats are possible to allow for different data signal properties and to permit the use of additional control bits.

Once the frame detect logic 844 detects six one's followed by a zero in the control signal field, mux control logic 848 is set to maintain the phase of the CK4 signal. If after a predetermined number of CK4 clock cycles a framing signal is not detected, then counter 850 will cause mux control logic 848 to change the phase of CK4 using mux 828 (FIG. 8). Counter 850 will then be reset, and frame detect logic 844 will again attempt to detect the selected framing signal so as to achieve synchronization. Only the correct phase of CK4 will achieve frame synchronization. Once frame synchronization is achieved, demux logic 846 can correctly decode control and data signals.

The specific structure and operation of frame detect logic 844, demux logic 846, and mux control logic 848 is dependent upon the selected framing format, the selected multiplexing scheme, and other design choices. The detailed design of this circuitry is within the ordinary skill in the art and is omitted from this description of a preferred embodiment.

Figure 9:
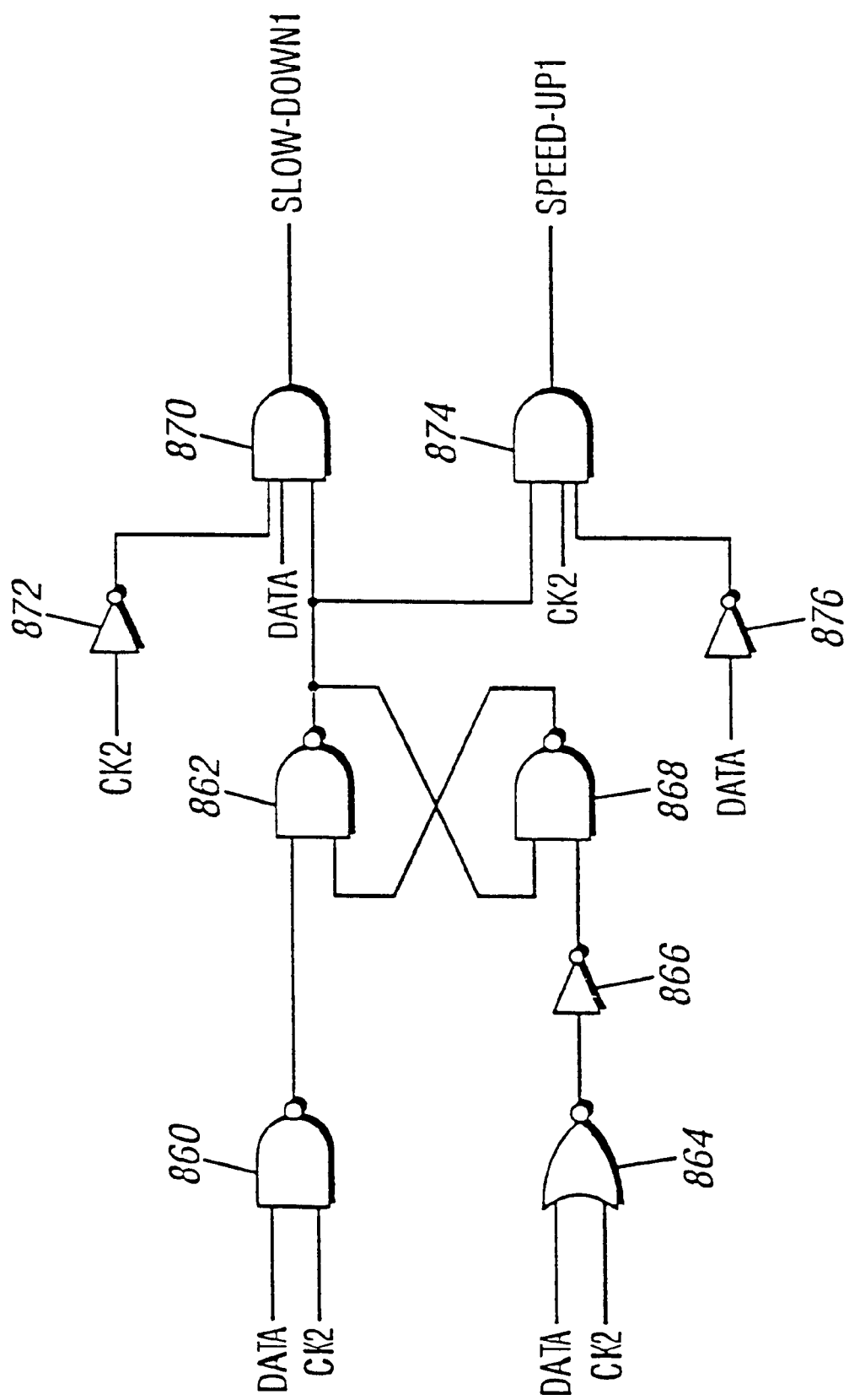
FIG. 9 is a schematic diagram of a phase detector circuit that may be used in a clock recovery circuit according to a preferred embodiment of the present invention.
Figure 10:
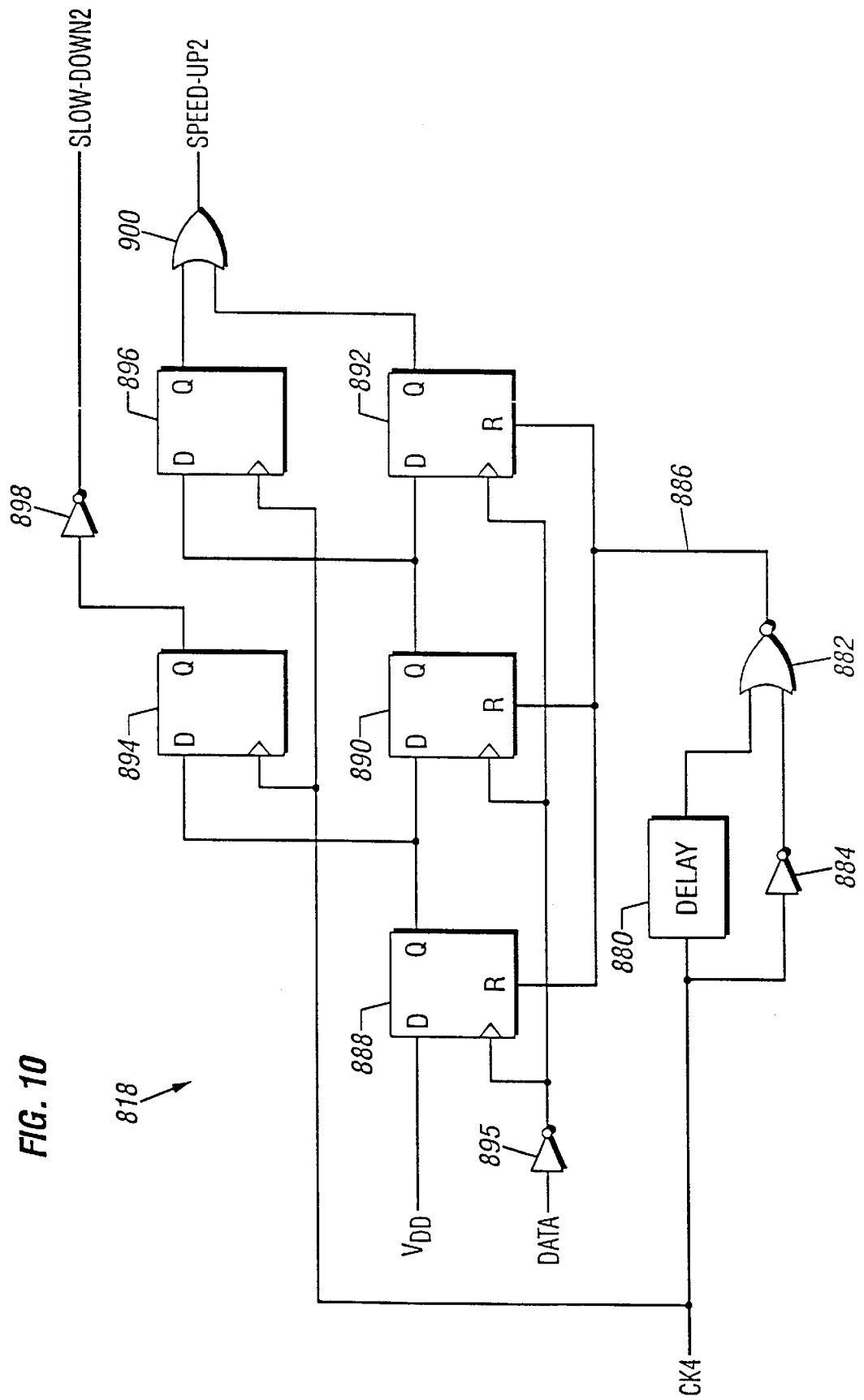
FIG. 10 is a schematic diagram of a frequency detector circuit that may be used in a clock recovery circuit according to a preferred embodiment of the present invention.

Exemplary embodiments of phase and frequency detectors 810, 818 are shown in FIGS. 9 and 10. Referring to FIG. 9, phase detector 810 has input signals CK2 and DATA and output signals SPEED-UP1 and SLOW-DOWN1. A two input NAND gate 860 has inputs DATA and CK2 and its output is connected to one input of NAND gate 862. A two input NOR gate 864 also has inputs DATA and CK2 and its output is connected to the input of inverter 866. A two input NAND gate 868 has one input connected to the output of the inverter 866 and one input connected to the output of NAND gate 862. NAND gate 862 has one input that is connected to the output of NAND gate 860 and the other input connected to the output of NAND gate 868. A three input AND gate 870 has one input connected to the output of inverter 872, another input connected to the DATA signal and another input connected to the output of NAND gate 862. The output of AND gate 870 is the SLOW-DOWN1 signal. The input of inverter 872 is connected to the CK2 signal. A three input AND gate 874 has one input connected to the output of NAND gate 862, another input is connected to the CK2 signal and another input is connected to the output of inverter 876. The output of AND gate 874 is the SPEED-UP1 signal. The input of inverter 876 is connected to receive the DATA signal.

In the illustrated embodiment, phase detector 810 compares the phase on the falling edges of DATA and CK2 after both signals are high at the same time. NAND gates 862 and 868 form a set-reset type latch. The latch gets "set" such that the output of NAND gate 862 is high when both the DATA and CK2 signals are high. The latch gets "reset" such that the output of NAND gate 862 is low when both DATA and CK2 are low. When the latch is "set" (i.e., both DATA and CK2 are high), AND gates 870 and 874 are enabled. Once the AND gates 870 and 874 are enabled they can compare the falling edges of CK2 and DATA to determine which signal goes low first. If DATA goes low first, then the SPEED-UP 1 signal will go high until CK2 also goes low, indicating that oscillator 535 needs to oscillate faster in order to achieve phase alignment with the DATA signal. If the CK2 signal goes low first then the SLOW-DOWN1 signal will go high until DATA also goes low, indicating that oscillator 535 should oscillate slower in order to achieve phase alignment with the DATA signal. The SPEED-UP1 and SLOW-DOWN1 signals are connected to phase detector charge-pump 816.

A preferred embodiment of frequency detector 818 is shown in FIG. 10. The inputs to frequency detector 818 are the DATA and CK4 signals and the outputs are the SPEED-UP2 and SLOW-DOWN2 signals. Delay cell 880 has its input connected to CK4 and output connected to one input of NOR gate 882. The delay cell 880 consists of an even number of capacitively loaded inverter stages or other delay generating circuitry and is well known in the art. The output of inverter 884 is connected to the other input of NOR gate 882 and the input of inverter 884 is connected to CK4. The output 886 of NOR gate 882 is reset pulse that occurs on the rising edge of CK4, and is connected to the reset input of D flip-flops 888, 890, and 892. The input of inverter 895 is connected to DATA. The output of inverter 895 is connected to the clock input of D flip-flops 888, 890, and 892. The D input of flip-flop 888 is connected to $V_{DD}$. The D-input of flip-flop 890 is connected to the Q-output of flip-flop 888. The D-input of flip-flop 892 is connected to the Q-output of flip-flop 890. D flip-flops 894 and 896 have their clock inputs connected to CK4. The D input of flip-flop 894 is connected to the Q output of flip-flop 888. The D-input of flip-flop 896 is connected to the Q-output of flip-flop 890. The input of inverter 898 is connected to the Q-output of flip-flop 894, and the output of inverter 898 is the SLOW-DOWN2 signal. OR gate 900 provides the SPEED-UP2 signal. One input of OR gate 900 is connected to the Q-output of flip-flop 896, and the other input is connected to the Q-output of flip-flop 892. The SPEED-UP2 and SLOW-DOWN2 signals are connected to the frequency-detector charge pump 824.

The illustrated embodiment of frequency detector 818 counts the number of DATA pulses within one CK4 cycle. The frequency of CK4 should equal to the bit rate of the DATA pattern. Suitable encoding used for the DATA signal will ensure that there will be only one CK4 rising edge for each data pulse falling edge, if the frequency of CK4 is equal to the data rate. If the CK4 frequency is equal to the data rate then the Q-output of flip-flop 888 will be high prior to each rising edge of CK4 and the Q-outputs of flip-flops 890 and 892 will be low prior to each rising edge of CK4. If the Q-output of flip-flop 888 is low prior to the rising edge of CK4 then the SLOW-DOWN2 signal will go high for the duration of the next CK4 cycle, signaling that oscillator 535 should slow down. If the Q-output of flip-flop 890 is high prior to the rising edge of CK4, then the SPEED-UP2 signal will go high for the duration of the next CK4 cycle signaling that the oscillator should speed up.

Figure 14:
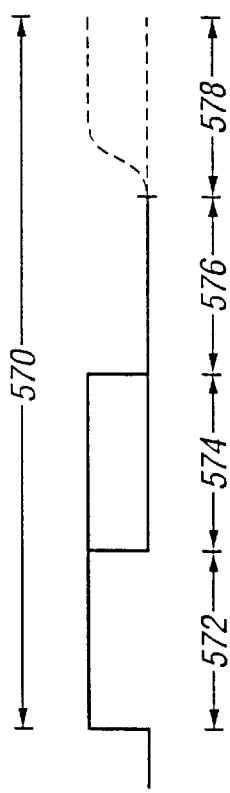
FIG. 14 is a timing diagram illustrating an alternative framing format that may be used in bidirectional embodiments of the present invention.

Another exemplary data coding scheme that may be used in an isolation system constructed in accordance with this invention is shown in FIG. 14. In this scheme, each bit period 570 is split into four fields. The first field 572 is referred to as the clock field and is always high independent of the data being transferred. The second field 574, which may occupy the second quarter of the bit period 570, contains the forward-going (from transmit side to receive side) data bit. This data bit can be either the delta-sigma data bit or a control bit or any desired type of encoding bit, in accordance with the requirements of the application in which the invention is used. The third field 576, which may occupy the third quarter of the bit period, is always low to ensure enough signal transitions to provide for power transmission in the forward path along with the first two fields, at least one of which is high in each bit period. The forward (transmit side) driver circuit is tri-stated during the fourth field 578, thus allowing for data transmission in the opposite direction across the isolation capacitor. Of course, this particular coding scheme is provided as an example, and many other coding schemes may be devised that will be operable in the various embodiments of the present invention.

It is desirable to use the logic "1" that is present at the beginning of each bit period for clock recovery, since it is always present at periodic intervals. However, if the reverse data bit from the previous bit period is a one, the rising edge at the beginning of the next bit period will not be readily seen by a logic gate and therefore will not be useful for clock recovery. To mitigate this effect and to allow reliable clock recovery, every fourth bit in the reverse field may be guaranteed to be zero by the encoding algorithms that are employed. The total frame length can be increased if more control bits need to be sent across the barrier in the reverse direction. Every fourth clock edge (the one associated with a zero in the previous reverse bit field) may then be used for clock recovery.

A block diagram of an exemplary PLL circuit that can perform clock recovery in accordance with the coding scheme of FIG. 14 is shown in FIG. 15. The forward data (conveyed from the transmit side to the receive side) is connected to divide-by-four counter 800. The output of counter 800 is connected to phase-frequency detector 801. The output of phase-frequency detector 801 is connected to charge pump 802. The output of charge pump 802 is connected to the input of loop filter 803. The output of loop filter 803 is connected to the input of voltage controlled oscillator (VCO) 804. The output of VCO 804 is the bit clock used for synchronizing the received data signal and for providing a clock signal to the receive side circuitry. The output of VCO 804 is also connected to the input of divide-by-four counter 805. The output of counter 805 is connected to the other input of phase-frequency detector 501. The phase-frequency detector 801 and the other circuits in the illustrated clock recovery circuit of FIG. 15 are well known in the art, and the specific circuitry selected for a particular application would be a matter of routine design choice.

Figure 16:
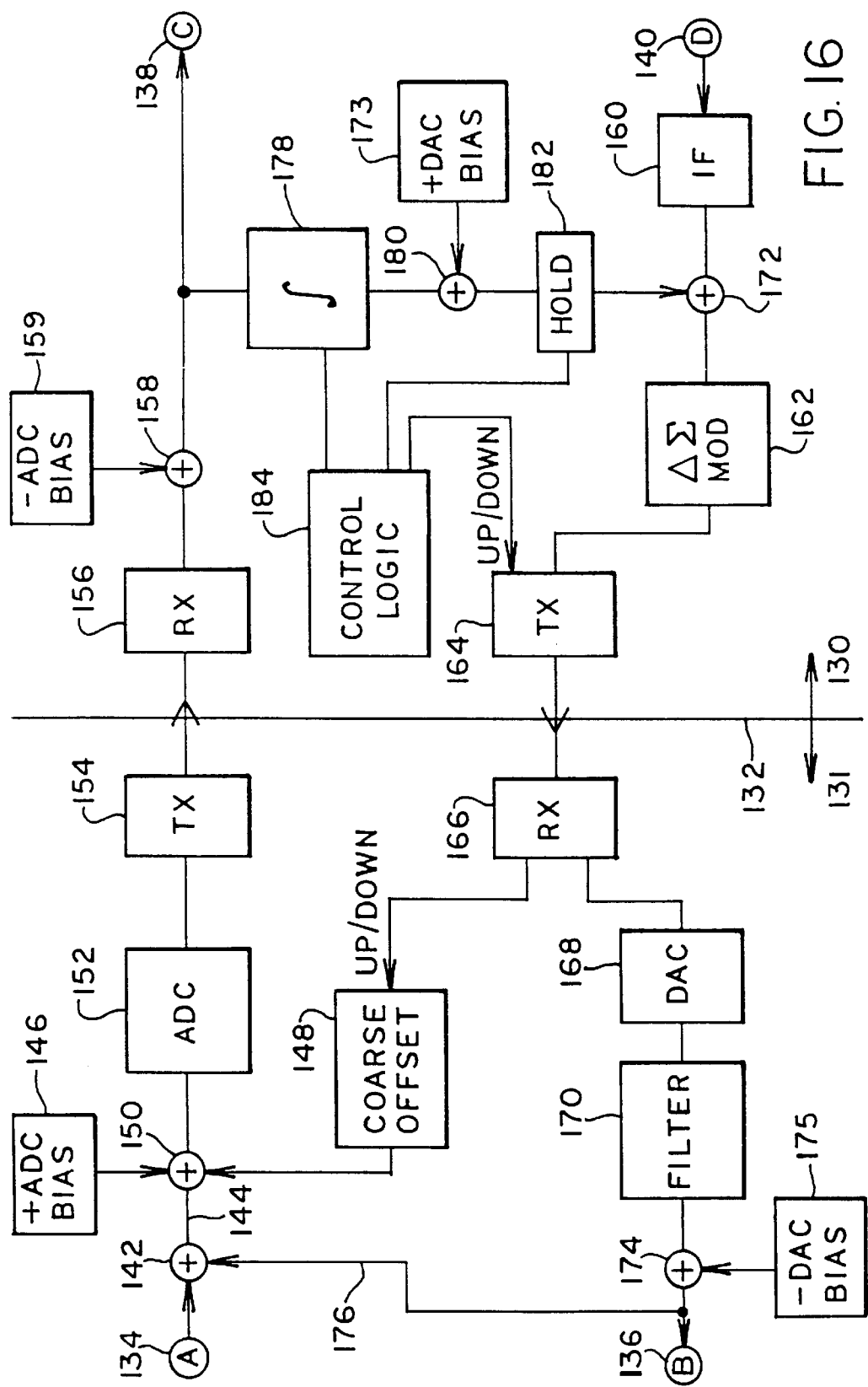
FIG. 16 is a block diagram showing a preferred embodiment of an isolation circuit including ADC offset calibration circuitry.

The present invention further provides a mechanism for calibrating an oversampled ADC across an isolation barrier. FIG. 16 illustrates a preferred embodiment of the apparatus that performs the offset calibration function. In this figure, the powered side 130 of the isolation barrier system is shown on the right, and the isolated side 131 is shown on the left. The isolation capacitors are located at isolation barrier 132 between transmitter 154 and receiver 156 and between transmitter 164 and receiver 166.

Referring to FIG. 16, the incoming analog signal from the phone line is received on the tip and ring conductors, which are connected through a hookswitch and some passive components to the isolated side of the barrier system. An incoming signal from the phone line is received at node A 134, and an outgoing signal to be placed on the phone line is provided at node B 136. The digital output signal to the powered side from the illustrated circuitry is shown at node C 138, and the digital input from the powered side into the illustrated circuitry occurs at node D 140. Note that many of the components of the isolation barrier system are not shown in FIG. 16, which is intended only to illustrate the offset calibration system.

The difference between the signals present at nodes A and B is provided by analog adder 142 to provide a base input signal on line 144. Selected bias levels may be applied to the ADC's and DAC's in this system in order to ensure good tone performance. At adder 150, a selected fixed ADC bias offset voltage provided by analog ADC bias source 146 is then added to the base input signal, as is an optional coarse adjust offset voltage provided by coarse adjust digital-to-analog converter 148, which will be discussed further below. The output of adder 150 is provided as the input signal to delta-sigma analog-to-digital converter (ADC) 152, which provides an oversampled 1-bit digital output signal to transmitter circuit 154 that transmits the signal across isolation barrier 132 to receiver circuit 156. The 1-bit digital signal is then combined with the inverse of the fixed ADC bias offset, provided by digital ADC bias source 159, in digital adder 158, which removes the fixed bias voltage from source 146 that was introduced through adder 150. The fixed bias voltage from source 146 is selected to optimize the operation of delta-sigma ADC 152 by causing it to operate in a preferred part of its range. The output of adder 158 provides a digital output signal corresponding to the incoming analog signal on line 144 which is provided to additional processing circuitry (not shown) through node C 138.

Part of the circuitry used to send signals from the powered equipment, such as a telephone or a modem, to the phone line in a preferred embodiment of the present invention is shown as the lower signal path of FIG. 16. The digital signal to be sent is coupled to node D 140 and passed through interpolation filter 160. The output of interpolation filter (IF) 160 is applied as the input to delta-sigma modulator 162, which converts a multi-bit digital signal to an oversampled one-bit digital signal that is passed across isolation barrier 132 from transmitter circuit 164 to receiver circuit 166. The one-bit digital signal is next input to 1-bit digital-to-analog converter (DAC) 168 and low-pass filter 170, which provides an analog output signal at node D 136, which may be connected to a public phone system line. Low pass filter 170 may be a switched capacitor filter. It is desirable to operate delta-sigma modulator 162 in a preferred portion of its operating range, so a selected fixed DAC offset is inserted into this signal path at digital adder 172 from digital DAC bias source 173 and removed at analog adder 174 using a signal from analog DAC bias source 175. Line 176 connects the outgoing analog signal to adder 142 so that it can be removed from the signal received at node A, thus performing the hybrid circuit function, which is well known in the art.

A delta-sigma ADC, such as ADC 152, typically produces an output signal that is inherently offset from the input signal by a fixed amount, due to processing variations and component mismatches. In order to compensate for this variable offset in the ADC, a compensating offset voltage may be added to the input signal supplied to the ADC. The magnitude of the compensating offset voltage may be determined automatically by calibrating the system when it is turned on, using a calibration system that will now be described.

Continuing to refer to FIG. 16, the calibration system operates with nodes A and D grounded, so that no input signal is presented to the circuit from either side. ADC 152 initially provides a digital output signal corresponding to the fixed ADC offset voltage from source 146 combined with the inherent variable offset of the ADC, which is initially unknown. The output signal from ADC 152 is passed across isolation barrier 132 to adder 158, which removes the fixed ADC offset from the received signal. The output of adder 158 is input to digital integrator 178, which provides an integrated output signal if the input signal is non-zero. In a preferred embodiment, the fixed DAC offset is added to the integrator 178 output at adder 180 (and later removed from the signal path at adder 174). The resulting digital offset signal, which includes the sum of the fixed DAC offset and the integrator output, is latched in register 182 and added to the digital input signal (which is zero in calibration mode) at adder 172. The digital offset signal then travels across the isolation barrier 132 on the lower, right-to-left pathway and it is converted to an analog voltage by DAC 168 and filter 170. The fixed DAC offset is removed at adder 174, so that an analog signal corresponding to the output of integrator 178 is placed on line 176 and fed back to adder 142, where it is inverted and applied as an input to ADC 152.

Integrator 178 may be any of several circuits known to persons skilled in the art. The gain of integrator 178 may be selected so as to cause the calibration loop to stabilize as quickly as possible, which will be a function of the detailed design of the circuitry in a specific embodiment. Once the input to integrator 178 becomes settled at zero (which is the input at node A and the desired output at node C), the output of integrator 178 will become a constant calibrated offset signal, and the signal latched into register 182 will become constant. The calibration control logic will detect that the calibration loop has settled and it will cause register 182 to hold its present value, which is the calibrated offset signal combined with the fixed DAC offset signal. The value held in register 182 will then be added to the input signal from node D through adder 172 when the circuitry begins normal operation.

In some cases, the offset voltage required to calibrate ADC 152 may result in a higher signal stored in register 182 than is desirable to inject into the data path at adder 172, because it may provide a higher offset level than delta-sigma modulator 162 is designed to handle.

In preferred embodiment of the invention, it is desirable to limit the range of the input to delta-sigma modulator 162 to the fixed DAC offset, which is added at 180, plus or minus a selected amount, delta. A signal outside of this range can be applied to delta-sigma modulator 162 if the output of integrator 178 exceeds delta, causing the performance of delta-sigma modulator 162 to be less than optimal. The calibration control logic may be adapted to detect such a situation and to activate coarse offset voltage generator 148 to insert a coarse offset voltage signal into the calibration loop through adder 150.

In a preferred embodiment, calibration control logic 184 senses if the input to delta-sigma modulator 162 is outside of the desired range during the calibration cycle. If it is, control logic 184 provides an "up" or "down" control signal that is transmitted across isolation barrier 132 through transmitter 164 and receiver 166 and then routed to coarse offset DAC 148. Coarse offset DAC 148 is adapted to receive the "up" and "down" signals and to increment or decrement its output voltage in response thereto. Coarse offset DAC 148 may be designed to provide a variety of output voltage levels, which may be multiples of the preselected threshold value delta mentioned above. In preferred embodiments, coarse offset DAC 148 includes a coarse offset register that holds a digital value that is converted to an output voltage by the DAC. The least significant bit of that register is chosen to represent an output voltage change of less than two times delta. When "up" and "down" signals are received by coarse offset DAC 148, they cause the value in the coarse offset register to increment or decrement by "1", respectively, resulting in a step-wise change in the coarse offset voltage signal.

After the coarse offset voltage is added to the loop at adder 150, the calibration operation continues as the integrator monitors the signal at node C and provides an output variable offset signal. If control logic 184 again detects that the input to delta-sigma modulator 162 is outside of the desired range, another up or down signal may be sent to cause coarse offset DAC 148 to add another unit of coarse offset voltage through adder 150. Eventually the calibration loop will stabilize with a signal corresponding to zero volts at node C, with a calibrated offset voltage provided by the combination of coarse offset DAC 148 and register 182, both of which are held constant during normal operation of the isolation barrier system. In preferred embodiments, coarse offset modifications are only made in the first half of the calibration time period. After that, the coarse offset signal is held constant so that the other offset calibration circuitry will have sufficient time to stabilize before normal operation begins.

Note that the "coarse offset" feature is not required in all systems, although it will provide better performance in some designs. In some systems, the coarse offset feature will be desirable to avoid applying the entire offset voltage required for optimal performance of ADC 152 to the input of delta-sigma modulator 162, which may have different offset requirements. The coarse offset feature also extends the calibration range to the range of coarse offset DAC 148, which will be beneficial in some applications.

Figure 17:
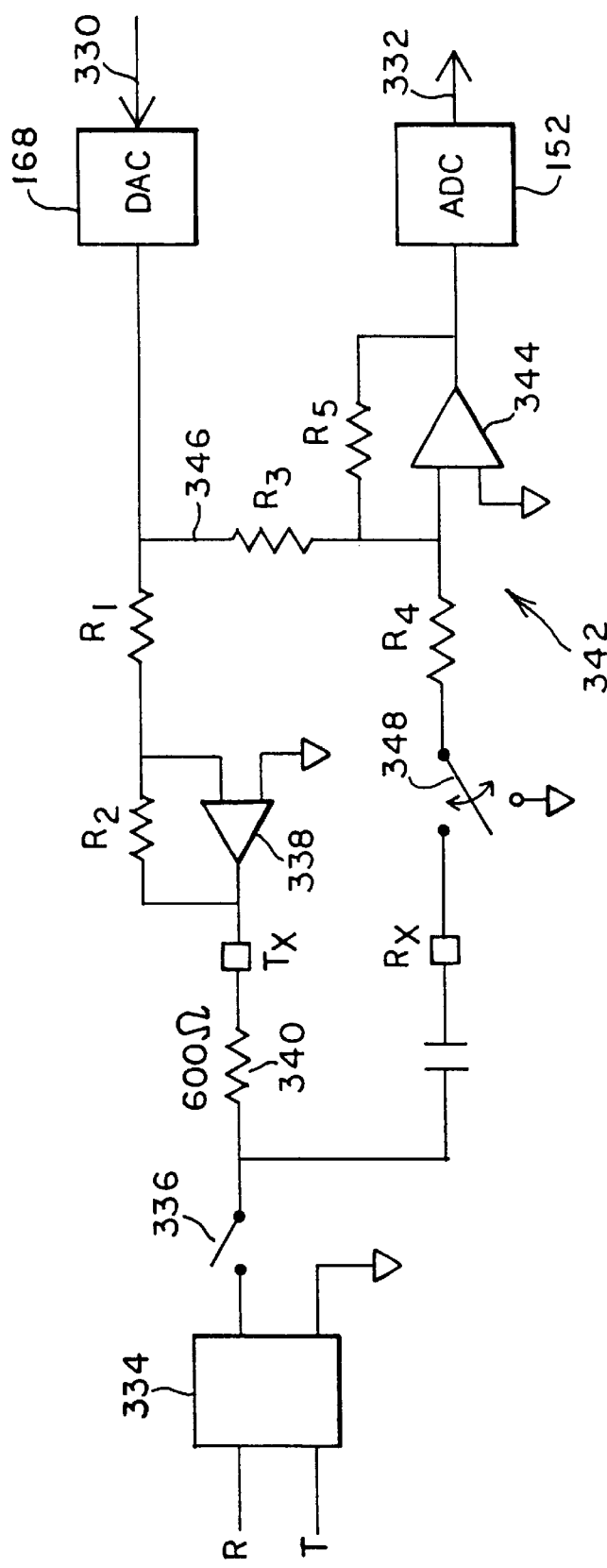
FIG. 17 is a schematic diagram of a portion of a preferred embodiment of the present invention, showing components that perform telecom hybrid and impedance matching functions.

In a preferred embodiment of the present invention, the telecom hybrid circuit may be used as a portion of the offset calibration loop. A normal function of the hybrid circuit is to cancel the transmitted signal into the receiver, as is well known in the art. Referring to the hybrid circuit shown in FIG. 17, the tip T and ring R connections to the public telephone system are shown at the left side connected to diode bridge 334 and hook switch 336. DAC 168 and ADC 152 are shown at the right side of the figure. (Note that this drawing is intended to be an explanatory schematic of this portion of the invention, and it does not show all circuits or components that may be included in a particular embodiment of the invention.) Digital signal 330 represents a signal that is to be transmitted from the user's equipment to the phone system, and digital signal 332 represents a signal that has been received from the phone system and digitized by ADC 152. The circuitry shown in FIG. 17 is all on the isolated side of an isolation barrier system, as described herein.

The analog output of DAC 168 is connected to resistor R1. Op-amp 338 and resistors R1 and R2 form an amplifier that acts as the transmit driver circuit, providing a signal to be delivered to the phone system at node TX. Off-chip resistor 340 is provided to match the nominal impedance of the public phone lines, in accordance with phone system specifications.

The incoming signals received from the phone system arrive at node RX, which is normally connected through switch 348 to amplifier circuit 342, comprising op-amp 344 and resistors R4 and R5. The output of amplifier 342 is provided as the analog input to ADC 152. It will be recognized that the signal received at node RX consists of the combination of the incoming signal from the telephone line through hookswitch 336 and a fraction of the outbound signal that is transmitted from op-amp 338 through node TX. The fraction of the transmitted signal that feeds back into the receive channel is dependent upon the ratio of resistor 340 to the impedance of the phone line; in the nominal case one half of the transmitted signal from node TX arrives at node RX.

The signal path that includes resistor R3 is provided to remove the transmitted signal from the receive channel by providing a portion of the signal output from DAC 168 into amplifier 342 in a subtractive sense, such that it cancels the portion of the transmitted signal that enters the receive channel. The amount of cancellation signal that is applied is determined by selection of the ratio of resistors R3 and R4, which is within the ordinary skill in the art. For example, in one embodiment of this invention, the resistor values were selected to be R1=45 k$\Omega$, R2=171 k$\Omega$, R3=36.6 k$\Omega$, R4=70 k$\Omega$, and R5=66 k$\Omega$. These values are exemplary only and are not intended to limit the scope of the present invention. Other resistance values and modifications to the circuit described herein will be apparent to one skilled in the art as being within the scope of the invention.

In preferred embodiments of the present invention, the hybrid circuit shown in FIG. 17 may be used to complete the offset calibration loop illustrated in FIG. 16 and described above. The hybrid circuit provides the connection shown by line 176 in FIG. 16 between the transmitting channel and the receiving channel. Referring to FIG. 17, when the isolation system is placed into offset calibration mode, switch 348 is operated to disconnect the received signal at node RX from amplifier circuit 342, and to ground the amplifier input instead. The calibration procedure may then be carried out, as described above, with the cancellation channel 346 of the hybrid circuit being used to complete the calibration loop. The calibration system described herein will stabilize with an appropriate value stored in register 182 to provide a DC offset voltage out of DAC 168 to correct for all ADC and hybrid offsets. After the calibration procedure is completed, switch 348 is returned to its normal position to connect the received signal to amplifier 342, and normal hybrid operation may be conducted.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the shape, size and arrangement of parts. For example, equivalent elements may be substituted for those illustrated and described herein, and certain features of the invention may be utilized independently of the use of other features, all as would be apparent to one skilled in the art after having the benefit of this description of the invention.

We claim:

1. An isolation system for providing an isolated telephone line communication channel for digital data signals in a forward direction and in a reverse direction across an isolation barrier comprised of one or more isolation elements, the system comprising:
   a plurality of isolation elements which form the isolation barrier, at least some of the isolation elements being isolation capacitors;
   a powered system on a first side of the isolation barrier, the powered system coupled to the isolation barrier for driving a forward direction digital signal across the isolation barrier;
   an isolated system on a second side of the isolation barrier, the isolated system coupled to the isolation barrier for driving a reverse direction digital signal across the isolation barrier; and
   an analog to digital converter located on the second side of the isolation barrier, the analog to digital converter configured to allow offset calibration, wherein the isolated system receives at least some power transferred from across the isolation barrier for providing a power supply on the second side of the isolation barrier.

2. The system of claim 1 wherein the forward direction digital signal and the reverse direction digital signal are both driven through at least one same isolation capacitor.

3. The system of claim 2 wherein the power transferred across the isolation barrier is transferred across at least one of the isolation capacitors.

4. The system of claim 1, further comprising an analog to digital converter offset calibration system, the analog to digital converter offset calibration system comprising:

an integrator coupled to receive an output signal from the analog to digital converter; and a digital to analog converter having an output providing an analog offset calibration signal, wherein the analog offset calibration signal is coupled to an input of the analog to digital converter.

5. The system of claim 4, wherein the digital to analog converter comprises a delta sigma modulator coupled to a one-bit digital to analog converter.

6. The system of claim 5, wherein the delta sigma modulator is located on the first side of the isolation barrier and the one-bit digital to analog converter is located on the second side of the isolation barrier.

7. The system of claim 4, wherein the analog to digital converter is located on the second side of the isolation barrier and the integrator is located on the first side of the isolation barrier.

8. The system of claim 4, wherein the analog to digital converter is a delta-sigma analog to digital converter.

9. The system of claim 4 wherein the forward direction digital signal and the reverse direction digital signal are both driven through at least one same isolation capacitor.

10. A method for providing digital communication across a telephone line isolation barrier, the telephone line isolation barrier comprising at least one isolation capacitor, the method comprising:

transmitting from a first side of the isolation barrier a transmitted digital signal to be communicated across at least one isolation capacitor;

receiving on a second side of the isolation barrier a received digital signal from at least one isolation capacitor;

providing an analog to digital converter on the second side of the isolation barrier;

generating on the second side of the isolation barrier a clock signal, the clock signal generated from information transmitted across the isolation barrier;

generating on the second side of the isolation barrier a power supply, the power supply generated from information transmitted the isolation barrier; and calibrating the offset of the analog to digital converter.

11. The method of claim 10, wherein the clock signal is generated from information transmitted across at least one isolation capacitor.

12. The method of claim 11, wherein the power supply is generated from information transmitted across at least one isolation capacitor.

13. The method of claim 12 wherein the same isolation capacitor is utilized for generating the clock signal and the power supply.

14. The method of claim 10, wherein the power supply is generated from information transmitted across at least one isolation capacitor.

15. A method claim 10, further comprising:

integrating an output signal from the analog to digital converter to provide an integrated offset calibration signal, and converting the integrated offset calibration signal from a digital signal to an analog offset calibration signal.

16. The method of claim 15, wherein the analog to digital converter output signal is transmitted across the isolation barrier before it is integrated.

17. The method of claim 16, wherein the analog to digital converter output signal is transmitted across at least one isolation capacitor before it is integrated.

18. The method of claim 17, wherein the integrated offset calibration signal is transmitted across the isolation barrier before it is converted to an analog offset calibration signal.

19. The method of claim 18, wherein the integrated offset calibration signal is transmitted across at least one isolation capacitor before it is converted to an analog offset calibration signal.

20. The method of claim 15, wherein the integrated offset calibration signal is transmitted across the isolation barrier before it is converted to an analog offset calibration signal.

21. The method of claim 20, wherein the integrated offset calibration signal is transmitted across at least one isolation capacitor before it is converted to an analog offset calibration signal.

* * * * *

UNITED STATES PATENT AND TRADEMARK OFFICE
CERTIFICATE OF CORRECTION

PATENT NO. : 6,323,796 B1  Page 1 of 1
DATED : November 27, 2001
INVENTOR(S) : Andrew W. Krone et al.

It is certified that error appears in the above-identified patent and that said Letters Patent is hereby corrected as shown below:

<u>Column 26,</u>
Line 21, please change "A method claim" to -- A method of claim --.

Signed and Sealed this

Fifteenth Day of October, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,323,796 B1
DATED : November 27, 2001
INVENTOR(S) : Krone et al.

It is certified that error appears in the above-identified patent and that said Letters Patent is hereby corrected as shown below:

Title page,
Item [30], Related U.S. Application Data, before "Continuation-in-part" please insert -- Continuation of application No. 09/034,456, filed on March 4, 1998, now Pat. No. 6,144,326, which is a --.

Column 1,
Line 4, after "This is a" and before "continuation-in-part" please insert -- continuation of U.S. Ser. No. 09/034,456, filed on March 4, 1998, now U.S. Pat. No. 6,144,326, which is a --.

Column 26,
Line 6, please change "transmitted the isolation barrier" to -- transmitted across the isolation barrier --.

Signed and Sealed this

First Day of June, 2004

JON W. DUDAS
*Acting Director of the United States Patent and Trademark Office*